(12) United States Patent
Kuroi et al.

(10) Patent No.: US 6,218,262 B1
(45) Date of Patent: Apr. 17, 2001

(54) SEMICONDUCTOR DEVICE AND METHOD OF MANUFACTURING THE SAME

(75) Inventors: Takashi Kuroi; Maiko Sakai; Katsuyuki Horita; Hirokazu Sayama, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/200,469

(22) Filed: Nov. 27, 1998

(30) Foreign Application Priority Data

Sep. 9, 1997 (JP) .................................................. 9-243993

(51) Int. Cl.[7] ........................ H01L 21/335; H01L 21/762
(52) U.S. Cl. .......................... 438/401; 438/430; 438/592; 438/975
(58) Field of Search .................................. 438/401, 430, 438/975, 592, 8, 462, FOR 435; 257/797

(56) References Cited

U.S. PATENT DOCUMENTS

| 4,717,687 | 1/1988 | Verma . |
| 4,737,468 | 4/1988 | Martin . |
| 4,992,394 | 2/1991 | Kostelak et al. . |
| 5,369,050 | 11/1994 | Kawai . |
| 5,578,519 | * 11/1996 | Cho . |
| 5,753,961 | * 5/1998 | Tsuchiaki . |
| 5,877,562 | * 3/1999 | Sur et al. . |

* cited by examiner

Primary Examiner—George Fourson
Assistant Examiner—Barbara E. Abbott
(74) Attorney, Agent, or Firm—Oblon, Spivak, McClelland, Maier & Neustadt, P.C.

(57) ABSTRACT

The present invention provides a semiconductor device which includes trench-type element isolation which performs accurate alignment without deteriorating a device capability, and a method of manufacturing such a semiconductor device. Since a dummy gate electrode (14A) is formed in an edge proximity region of a trench (10A), a structure which does not create an etching remainder is realized. In addition, since a height difference is provided in a surface of the dummy gate electrode (14A) in such a manner that the height difference reflects a preliminary height difference between a surface of a silicon oxide films (2A) and a surface of a silicon substrate (1), it is possible to use the dummy gate electrode itself (14A) as an alignment mark.

6 Claims, 27 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, to an alignment mark for accurately aligning an element activation region to a first electrode.

2. Description of the Background Art

During production of a semiconductor integrated circuit, in order to control individual elements completely independently from each other by eliminating electric interference between the elements when the elements operate, it is necessary to form an element isolation structure which includes an element isolation region. As an element isolation method, trench-type element isolation has been proposed which requires to form a trench in a semiconductor substrate and bury an insulation film in the trench.

In the following, a conventional trench-type element isolation structure and a method of manufacturing the same will be described. FIG. 40 shows a cross sectional structure of a DRAM as it is after a trench-type element isolation structure is formed. Trenches 10A to 10C are formed within a silicon substrate 1. More precisely, the trench 10B which has a narrow width is formed in a memory cell area 11B, and the trenches 10A and 10C which are wider than the trench 10B are formed respectively in an alignment mark area 11A and a peripheral circuit area 11C. Silicon oxide films 2A to 2C are buried in the trenches 10A to 10C.

The height of a surface of the silicon oxide film 2 within the trenches is approximately the same as the height of a surface of the silicon substrate 1 except for the silicon oxide film 2. As a result, the surface of the silicon substrate 1 is approximately flat.

FIGS. 41 to 47 are cross sectional views showing a method of manufacturing the DRAM which has such a structure which is shown in FIG. 40. Now, the manufacturing method will be described with reference to FIGS. 41 to 47.

First, after forming a silicon oxide film 3 and a silicon nitride film 4 in this order on the silicon substrate 1, the silicon nitride film 4 and the silicon oxide film 3 in a predetermined region are removed using a photolithographic technology and a dry etching technology, thereby forming a trench 10 (10A to 10C) of a predetermined depth in the silicon substrate 1. That is, the relatively wide trench 10A is formed in the alignment mark area 11A, the relatively narrow trench 10B is formed in the memory cell area 11B, and the relatively wide trench 10C is formed in the peripheral circuit area 11C.

Following this, as shown in FIG. 42, after thermally oxidizing side surfaces and bottom surfaces of the trenches 10, the silicon oxide film 2 is deposited by the LP-CVD (low pressure CVD) method. At this stage, since the silicon oxide film 2 is buried in the relatively narrow trench 10B during an initial stage of the deposition while the silicon oxide film 2 is deposited into a film thickness which is equal to the deposited film thickness within the relatively wide trenches 10A and 10C, a film thickness of the silicon oxide film 2 as viewed from the bottom of the trench 10B is thicker than the film thickness of the silicon oxide film 2 within the alignment mark area 11A and the peripheral circuit area 11C. That is, the silicon oxide film 2 which is deposited on the trench 10B is different in film thickness from the silicon oxide film 2 which is deposited on the trenches 10A and 10C. In the following, the difference will be referred to as an on-the-trench silicon oxide film thickness difference.

Next, as shown in FIG. 43, to reduce the on-the-trench silicon oxide film thickness difference, a resist pattern 5 is formed only on the silicon oxide film 2 where the width of the silicon oxide film 2 is wide, using a photolithographic technology. The silicon oxide film 2 is thereafter partially removed by dry etching.

Following this, after removing the resist pattern 5, the entire surface is polished by the CMP (Chemical Mechanical Polishing) method, thereby removing the silicon oxide film 2 on the silicon nitride film 4 and partially removing the silicon oxide film 2 within the trenches 10A to 10C. Next, as shown in FIG. 44, the silicon nitride film 4 is removed using phosphoric acid and the silicon oxide film 3 is removed using hydrofluoric acid, so that the buried silicon oxide film 2A is formed within the alignment mark area 11A, the buried silicon oxide film 2B is formed within the memory cell area 11B, the buried silicon oxide film 2C is formed within the peripheral circuit area 11C, thereby completing a trench-type element isolation structure.

Following this, as shown in FIG. 45, a gate oxide film 6 is formed by thermal oxidation, and a polysilicon film 7 and a tungsten silicide film 8 which are doped with phosphorus are deposited in this order on the gate oxide film 6.

Next, as shown in FIG. 46, using the buried silicon oxide film 2A (i.e., alignment mark) formed within the alignment mark area 11A at the element isolation step, by a photolithographic technology, a resist pattern 9 is formed which aligns a gate electrode to an element isolation region.

As shown in FIG. 47, the tungsten silicide film 8 and the polysilicon film 7 are removed by dry etching using the resist pattern 9 as a mask, whereby a gate electrode portion 14 (14B to 14D) is formed in the memory cell area 11B and the peripheral circuit area 11C. The gate electrode portion 14D is used for alignment during formation of a contact hole to an active region which will be formed at a later step.

The conventional semiconductor device (DRAM) and the method of manufacturing the same described above have the following problems.

During patterning of the gate electrode portion 14 which is a first electrode material, in order to form a pattern in a predetermined area of the active region, it is necessary to align the gate electrode portion 14 to the active region. For alignment, an alignment mark 2A of the alignment mark area 11A which is formed at the element isolation step is used.

Alignment methods are generally classified into a first method which recognizes a mark by means of detection of diffraction light which does not photosensitize a resist and a second method which recognizes image information. In the first method which detects a mark using diffraction light, a surface of a semiconductor substrate must includes a step portion which is created by a mark which is formed on the semiconductor substrate. In the second which detects by means of image recognition, a gate electrode material must transmit light so that mark information underneath is detected or a step portion formed at a surface must allow recognition of the mark information.

However, in a conventional semiconductor device which includes trench-type element isolation, since an alignment mark portion creates almost no step portion, detection of the mark is difficult with the first method which utilizes a stepped surface. Meanwhile, since a silicide film, which is contained as a gate electrode material, does not transmit light, detection of the mark is difficult also with the second method which utilizes image recognition.

As a result, a mark detect signal has a small S/N ratio which deteriorates an alignment accuracy, so that it is not possible to perform alignment during formation of a gate electrode.

If the buried silicon oxide film 2A is formed lower than the surface of the substrate to solve such a problem, the alignment accuracy is improved. However, this causes that the surfaces of the buried silicon oxide films 2B and 2C of an element formation region (i.e., the memory cell area 11B and the peripheral circuit area 11C), which is formed simultaneously with the buried silicon oxide film 2A, to be lower than the surface of the substrate.

This in turn concentrates electric fields from the gate electrode, so that a hump appears in a current/voltage characteristic of a transistor, and a threshold voltage and a current during a wait period vary largely.

At the same time, the film thickness of the gate electrode material becomes larger at trench edge portions of the buried silicon oxide films 2B and 2C, and therefore, the electrode material remains left in an edge proximity region within the trench 10A during etching of the electrode, which in turn degrades a yield of the elements.

On the other hand, the buried silicon oxide film 2A within the trench may be formed higher than the surface of the substrate, in which case the alignment accuracy is improved and a hump in the current/voltage characteristic of the transistor is suppressed. However, a large step portion is created at an edge portion of the trench and the film thickness of the gate electrode material becomes large on the edge, and therefore, the electrode material remains left in the edge proximity region of the trench during etching of the electrode, which in turn degrades a yield of the elements.

SUMMARY OF THE INVENTION

A first aspect of the present invention is directed to a semiconductor device in which semiconductor elements are isolated from each other by a trench-type element isolation structure, comprising: a semiconductor substrate; and an alignment mark area which is formed on the semiconductor substrate, the alignment mark area including a first trench which is formed in an upper portion of the semiconductor substrate and an intra-alignment mark insulation film formed in an under portion which is formed within the first trench, wherein the height of a surface of the intra-alignment mark insulation film is lower than the height of a surface of the semiconductor substrate, and the semiconductor device further comprises: an element formation region which is formed in the semiconductor substrate, the element formation region including an element-isolation insulation film for which isolates a plurality of semiconductor elements from each other, the element-isolation insulation film filling up a second trench which is formed on the upper portion of the semiconductor substrate; and a first dummy layer which is formed covering at least an edge proximity region of the first trench.

Accordingly, in the semiconductor device of the first aspect of the present invention, the surface of the intra-alignment mark insulation film is lower than the height of the surface of the semiconductor substrate, so that a preliminary height difference is provided between the surface of the intra-alignment mark insulation film and the height of the surface of the semiconductor substrate.

Hence, when an upper formation layer is formed on the semiconductor substrate including the intra-alignment mark insulation film before the first dummy layer is formed, a height difference reflecting the preliminary height difference is formed in the upper formation layer. The height difference which is formed in the upper formation layer makes it easy to detect the position of the alignment mark, and therefore, it is possible to fabricate the semiconductor device with an excellent positional accuracy.

In addition, since the first dummy layer is formed covering at least the edge proximity region of the first trench, an etching remainder is not provided in the edge proximity region of the first trench at steps after the first dummy layer is formed, which in turn suppresses a deterioration in a yield associated with an etching remainder.

According to a second aspect of the present invention, the semiconductor device of the first aspect further comprises a gate electrode portion which is formed on the element formation region, and the gate electrode portion is formed by the same material as the first dummy layer.

Hence, when an upper conductive layer which serves as a gate electrode material is formed on the semiconductor substrate including the intra-alignment mark insulation film, a height difference is formed in the upper conductive layer in such a manner that the preliminary height difference reflects the height difference between the surface of the intra-alignment mark insulation film and the surface of the semiconductor substrate. The height difference which is formed in the upper conduction layer makes it easy to detect the position of the alignment mark, and therefore, it is possible to pattern the upper conduction layer with an excellent positional accuracy to thereby form the gate electrode portion while simultaneously forming the first dummy layer.

According to a third aspect of the present invention, in the semiconductor device of the second aspect, the first dummy layer is formed covering the first trench including the intra-alignment mark insulation film, and a height difference is formed in the first dummy layer in such a manner that the height difference reflects a preliminary height difference between the surface of the intra-alignment mark insulation film and the surface of the semiconductor substrate.

In the semiconductor device of the third aspect, since the first dummy layer is formed covering the first trench including the intra-alignment mark insulation film and the height difference formed in the first dummy layer reflects the preliminary height difference between the surface of the intra-alignment mark insulation film and the surface of the semiconductor substrate, it is possible to accurately align a pattern which is formed after the gate electrode portion is formed, using the first dummy layer as an alignment mark.

According to a fourth aspect of the present invention, the semiconductor device of the third aspect further comprises: a diffusion region which is formed adjacent to the gate electrode portion in a surface of the gate electrode portion; an insulation layer which is formed entirely over the semiconductor substrate including the first dummy layer and the gate electrode portion, the insulation layer including a through hole which is formed on the diffusion region in such a manner to penetrate itself, and a diffusion region connecting conduction layer which is electrically connected to the diffusion region through the through hole.

Thus, the semiconductor device of the fourth aspect comprises the diffusion region connecting conduction layer which is electrically connected to the diffusion region through the through hole which is formed in the insulation layer on the semiconductor substrate.

Using the first dummy layer as an alignment mark, it is possible to accurately align a pattern which is used for forming the through hole.

According to a fifth aspect of the present invention, the semiconductor device of the fourth aspect further comprises a second dummy layer which is formed on a predetermined region of the alignment region other than the first trench of the alignment region.

Since the semiconductor device of the fifth aspect comprises the second dummy layer which is formed on the predetermined region of the alignment region other than the first trench of the alignment region, it is possible to accurately align a pattern which is formed after the second dummy layer is formed, using the second dummy layer as an alignment mark.

According to a sixth aspect of the present invention, in the semiconductor device of the first aspect, the surface of the intra-alignment mark insulation film is lower than the surface of the semiconductor substrate by 30 nm or more.

Since the surface of the intra-alignment mark insulation film is lower than the surface of the semiconductor substrate by 30 nm or more in the semiconductor device of the sixth aspect, even when an upper formation layer is formed on the intra-alignment mark insulation film, it is relatively easy to provide a height difference formed in the upper formation layer reflects the preliminary height difference between the intra-alignment mark insulation film and the semiconductor substrate.

According to a seventh aspect of the present invention, in the semiconductor device of the first aspect, the materials of the gate electrode portion and the first dummy layer contain a metal layer or a metal compound layer.

In the semiconductor device of the seventh aspect, the gate electrode portion and the first dummy layer is a metal layer or a metal compound layer, and in a condition where an upper conductive layer which serves as a gate electrode material is formed on the entire surface during fabrication, it is not possible to recognize as an image the intra-alignment mark insulation film which underlies the upper conductive layer. However, since the preliminary height difference between the intra-alignment mark insulation film and the semiconductor substrate is reflected as the height difference which is provided in the upper conductive layer, it is possible to detect the position of the alignment mark by means of the height difference, and therefore, it is possible to obtain the gate electrode portion which is excellently patterned in accordance with the alignment mark.

An eighth aspect of the present invention is directed to a method of manufacturing a semiconductor device which contains a trench-type element isolation structure, comprising the steps of: (a) preparing a semiconductor substrate which includes an alignment mark area and an element formation region; (b) forming a first trench and a second trench at the same time in an upper portion of the alignment mark area and element formation region respectively; (c) forming an insulation film entirely on the semiconductor substrate; (d) forming a first resist pattern on the insulation film other than in at least the portion of the insulation film which corresponds to the alignment mark area; (e) removing the isolation film using the first resist pattern as a mask; (f) further entirely removing the isolation film after removing the first resist pattern, the step (f) being carried out so that the insulation film is partially left within the first trench and that the insulation film which is buried in the second trench, the portion of the first trench as it is after the step (f) being defined as a first alignment mark, the height of a surface of an intra-alignment mark insulation film which is the insulation film within the first trench being lower than the height of a surface of the semiconductor substrate so that a height difference set between the surfaces; (g) forming a conductive layer entirely on the semiconductor substrate; (h) recognizing the location of the first alignment mark and forming a second resist pattern on a predetermined gate formation region of the element formation region and at least on an edge proximity region of the first trench; and (i) removing the conductive layer using the second resist pattern as a mask, forming a gate electrode portion on the predetermined gate formation region and forming a first dummy electrode portion at least on the edge proximity region of the first trench.

In the manufacturing method of the eighth aspect of the present invention, since the height of the surface of the intra-alignment mark insulation film is lower than the height of the surface of the semiconductor substrate so that the preliminary height difference is between the intra-alignment mark insulation film and the semiconductor substrate provided, at the step (h), it is easy to detect the position of the first alignment mark by means of the height difference which is provided in the conductive layer itself in accordance with the preliminary height difference, and therefore, it is possible to detect the gate electrode portion in accordance with the first alignment mark at an excellent positional accuracy.

In addition, since the first dummy electrode portion is formed at least on the edge proximity region of the first trench at the step (i), an etching remainder is not created in the edge region of the first trench, which suppresses a deterioration in a yield associated with an etching remainder.

According to a ninth aspect of the present invention, in the manufacturing method of the eighth aspect, the second resist pattern is further formed on the entire region in which the first trench is formed, and the first dummy electrode portion is formed covering the first trench including the intra-alignment mark insulation film, while a height difference is formed in the first dummy electrode portion in such a manner that the height difference reflects a preliminary height difference between the surface of the intra-alignment mark insulation film and the surface of the semiconductor substrate.

In the manufacturing method of the ninth aspect, the first dummy electrode portion is formed covering the first trench including the intra-alignment mark insulation film, and the height difference is formed in the first dummy electrode portion in such a manner that the height difference reflects a preliminary height difference between the surface of the intra-alignment mark insulation film and the surface of the semiconductor substrate. Hence, using the first dummy electrode portion as an alignment mark, it is possible to accurately align a pattern which is formed after the step (h).

According to a tenth aspect of the present invention, the manufacturing method of the ninth aspect further comprises the steps of: (j) forming a diffusion region adjacent to the gate electrode within a surface of the element formation region; (k) forming an insulation layer entirely over the semiconductor substrate; (l) recognizing the location of the first dummy electrode portion as a second alignment mark and forming a through hole which penetrates the insulation layer on the diffusion region; and (m) forming a diffusion region connecting conduction layer which is electrically connected to the diffusion region through the through hole.

In the manufacturing method of the tenth aspect, since the position of the first dummy electrode portion is recognized as the second alignment mark and the through hole is formed penetrating the insulation layer on the diffusion region at the step (i), it is possible to form the through hole with an excellent positional accuracy.

According to an eleventh aspect of the present invention, in the manufacturing method of the ninth aspect, the gate electrode includes at least one gate electrode, the second resist pattern is further formed on a predetermined region of the alignment region other than the first trench, and a second dummy electrode portion is formed on the predetermined region of the alignment mark area at the step (i), and the manufacturing method comprises a step of: (j) forming a first to an N-th diffusion regions (N≧2) adjacent to one of the at least one gate electrodes within a surface of the element formation region, the method further comprising steps (k) to (m), wherein the steps (k) to (m) are repeated N times in an order of i=1 to N; (k) forming an i-th insulation layer entirely over the semiconductor substrate; (l) recognizing the location of a second alignment mark and forming a first to an i-th through holes which penetrate a first to an i-th insulation layers on the i-th diffusion region; and (m) forming an i-th diffusion region connecting conduction layer which is electrically connected to the i-th diffusion region through the i-th through hole the method further comprising steps (k) to (m), wherein the step (l) which is repeated N times requires to select either one of the first and the second dummy electrode portions as the second alignment mark for every execution of the step (l).

In the manufacturing method of the eleventh aspect, at the step (l) which is repeated N times, either one of the first and the second dummy electrode portions is selected as the second alignment mark for every execution of the step (l).

Since the position of the first dummy electrode portion is determined when the first and the second trenches are formed, the positional accuracy of the first dummy electrode portion with respect to the element isolation structure is high. Since the second dummy electrode portion is formed simultaneously when the gate electrode portion is formed, the positional accuracy of the second dummy electrode portion with respect to the gate electrode portion high. Utilizing such characteristics of the positional accuracies of the first and the second dummy electrode portions, in accordance with a positional accuracy which is demanded for an i-th through hole, the better one may be used as the second alignment mark. This allows to manufacture with further better positional accuracies.

According to a twelfth aspect of the present invention, in the manufacturing method of the eighth aspect, the second trench includes a trench for a first circuit which is relatively narrow and a trench for a second circuit which is relatively wide, the element formation region includes a first circuit formation region which is element-isolated by the trench for the first circuit and a second circuit formation region which is element-isolated by the trench for the second circuit, and the step (d) does not require to form the first resist pattern on the insulation film which corresponds to the first circuit formation region but requires to form the first resist pattern on the insulation film which corresponds to the second circuit formation region.

In the manufacturing method of the twelfth aspect, the element formation region includes the relatively narrow first circuit formation region which is element-isolated by the trench for the first circuit and the relatively wide second circuit formation region which is element-isolated by the trench for the second circuit.

Since the film thickness of the insulation film which is formed on the relatively narrow first circuit formation region is inherently larger than the film thickness of the insulation film which is formed on the relatively wide second circuit formation region, it is necessary to remove more insulation film on the first circuit formation region than on the second circuit formation region, and therefore, a step of selectively removing the insulation film on the first circuit formation region is essential.

Hence, at the step (d), it is possible to remove the first circuit formation region and the insulation film which corresponds to the alignment mark area at the same time.

According to a thirteenth aspect of the present invention, in the manufacturing method of the twelfth aspect, the first circuit formation region includes a region which is constituted of a memory cell of a dynamic type, and the second circuit formation region includes a region which forms a peripheral circuit which drives the memory cell.

In the manufacturing method of the thirteenth aspect, since the first circuit formation region includes a region which is constituted of a dynamic memory cell, it is possible to accurately pattern an electrode layer of the dynamic memory cell.

Accordingly, an object of the present invention is to provide for a semiconductor device with trench-type element isolation which allows accurate alignment without deteriorating a device capability, and a method of manufacturing such a semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Principle of the Invention

To perform alignment accurately without deteriorating a device capability, a silicon oxide film 2 on an alignment mark area 11A may be partially removed in advance and a step portion may be formed when a gate electrode material is formed.

Figure 25:
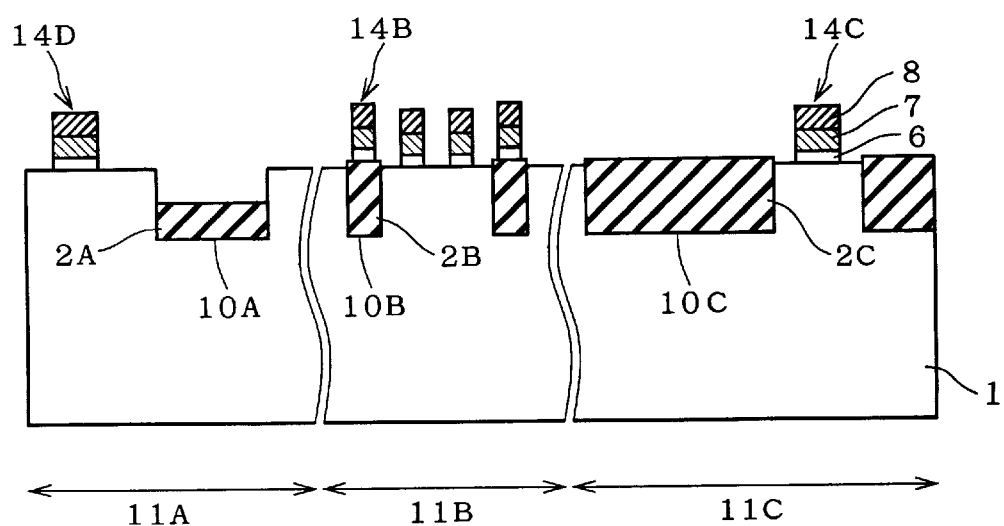
FIG. 25 is a cross sectional view of a semiconductor device which is formed by an improved method, which is principle of the present invention.

In the following, a trench-type element isolation structure and a method of manufacturing the same (hereinafter referred to as an "improved method" in some cases) based on this concept will be described. FIG. 25 shows a cross sectional structure of a semiconductor device as it is after trench-type element isolation is formed and a gate electrode is patterned. Trenches 10A, 10B and 10C are formed in the alignment mark area 11A, a memory cell area 11B and a peripheral circuit area 11C, respectively, of a silicon substrate 1, and silicon oxide films 2A and 2B are buried in the trenches 10A, 10B and 10C. While surfaces of the silicon oxide films 2B and 2C, which are formed within the trenches 10B and 10C of an element formation region (i.e., the memory cell area 11B and the peripheral circuit area 11C) in the silicon substrate 1, are approximately at the same height as a surface of the silicon substrate 1, a surface of the silicon oxide film 2A, which is formed within the trench 10A of the alignment mark area 11A, is lower than the surface of the silicon substrate 1.

Gate electrode portions 14D, 14B and 14C are formed in the alignment mark area 11A, the memory cell area 11B and the peripheral circuit area 11C, respectively.

FIGS. 26 to 32 are cross sectional views showing a method of manufacturing the semiconductor device of FIG. 25. Now, the manufacturing method will be described with reference to FIGS. 26 to 32.

Figure 26:
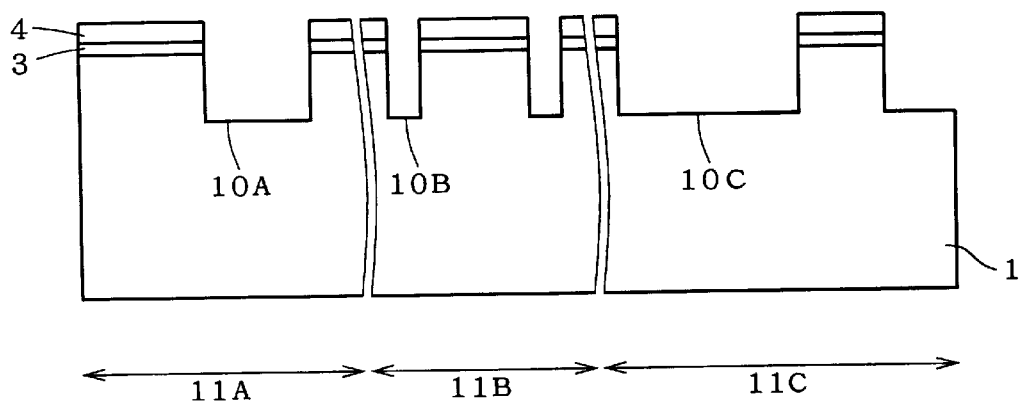
FIGS. 26 to 32 are cross sectional views showing a method of manufacturing the semiconductor device of FIG. 25.

First, after forming a silicon oxide film 3 and a silicon nitride film 4 in this order on the silicon substrate 1, the silicon nitride film 4 and the silicon oxide film 3 in a predetermined region and a portion of the silicon substrate 1 are removed using a photolithographic technology and a dry etching technology, thereby forming the trenches 10A, 10B and 10C to a predetermined depth in the alignment mark areas 11A, 11B and 11C of the silicon substrate 1 as shown in FIG. 26.

Figure 27:
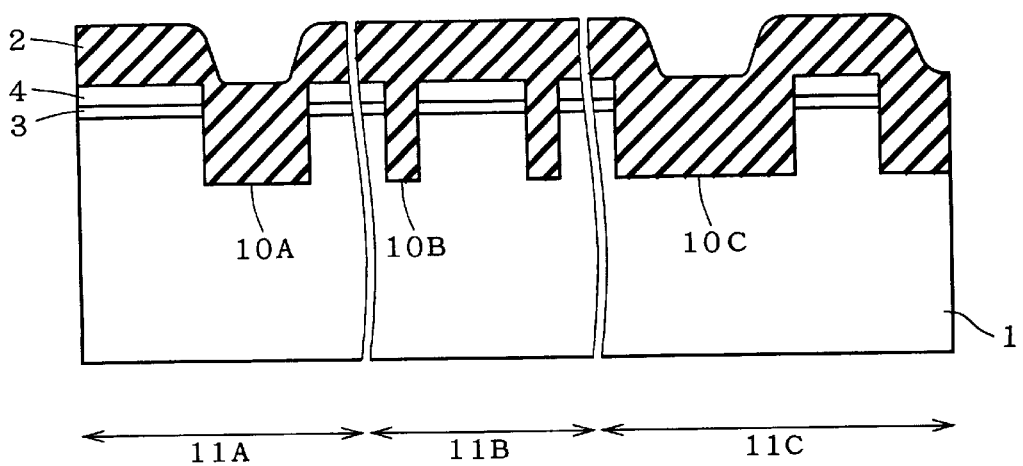

Following this, as shown in FIG. 27, after thermally oxidizing side surfaces and bottom surfaces of the trenches 10A, 10B and 10C, the silicon oxide film 2 is deposited by the CVD method. At this stage since the silicon oxide film 2 is buried in the relatively narrow trench 10B during an initial stage of the deposition while the silicon oxide film 2 is deposited into a film thickness which is equal to the deposited film thickness within the relatively wide trenches 10A and 10C, a film thickness of the silicon oxide film 2 as viewed from the bottom of the trench 10B is thicker than the film thickness in the alignment mark area 11A and the peripheral circuit area 11C. As a result, an on-the-trench silicon oxide film thickness difference is created.

Figure 28:
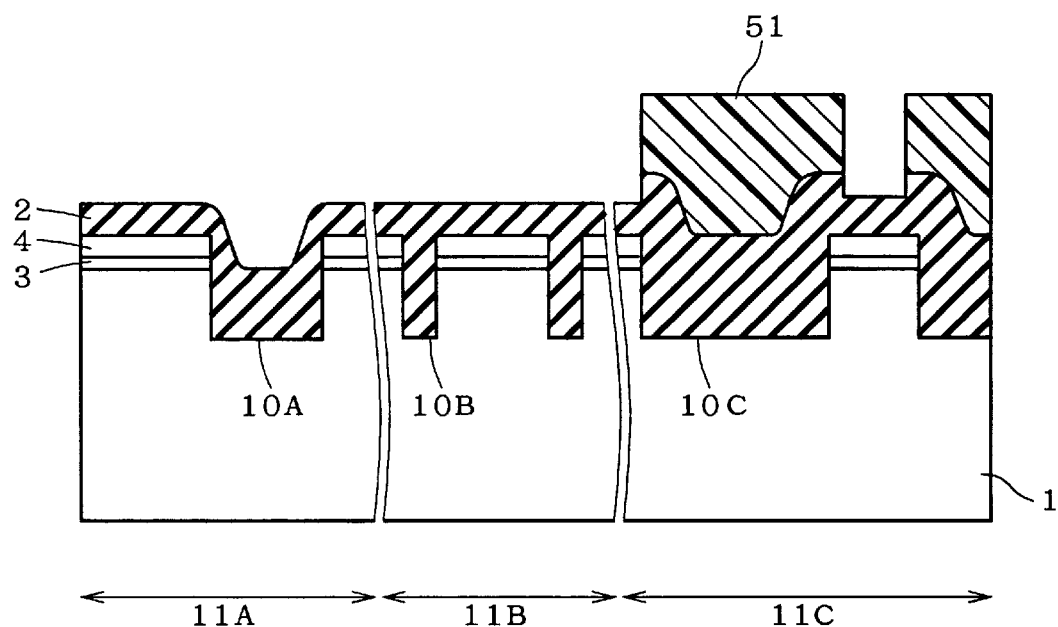

Next, as shown in FIG. 28, to reduce the on-the-trench silicon oxide film thickness difference, a resist pattern 51 is formed only on the buried silicon oxide film 2 which is formed on the trench 10C of the peripheral circuit area 11C using a photolithographic technology, and the silicon oxide film 2 is partially removed by dry etching. At this stage, a portion of the silicon oxide film 2 on the trench 10A of the alignment mark area 11A is removed and the film thickness is reduced at the same time.

Figure 29:
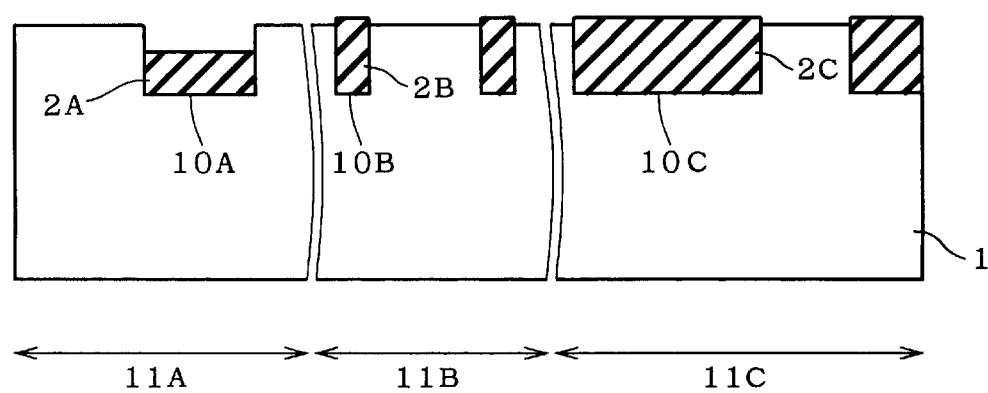

Following this, after removing the resist pattern 51, the entire surface is polished by the CMP (Chemical Mechanical Polishing) method, thereby removing the silicon oxide film 2 on the silicon nitride film 4 and partially removing the silicon oxide film 2 within the trench portion. The silicon nitride film 4 is removed using phosphoric acid and the silicon oxide film 3 is removed using hydrofluoric acid, thereby completing a trench-type element isolation structure as shown in FIG. 29.

At this stage, while a surface of the silicon oxide film 2 within the trenches 10B and 10C of the element formation region (i.e., the memory cell area 11B and the peripheral circuit area 11C) is approximately at the same height as the surface of the silicon substrate 1, the height of the surface of the silicon oxide film 2 within the trench 10A of the alignment mark area 11A is lower than the height of the surface of the silicon substrate 1. Therefore, a resulting height difference between the silicon oxide film 2A within the trench 10A and the surface of the silicon substrate 1 forms an alignment mark.

Figure 30:
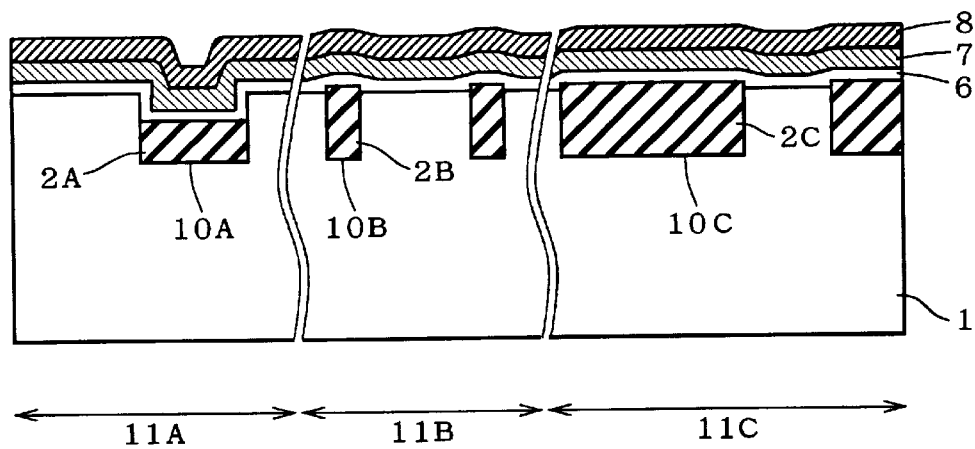

Next, an n-well and a p-well are formed by ion implantation in a predetermined area of the element formation region. After ion implantation for controlling a threshold value of a field effective transistor, as shown in FIG. 30, a gate oxide film 6 is formed by thermal oxidation, and a polysilicon film 7 and a tungsten silicide film 8 which are doped with phosphorus are formed in this order on the gate oxide film 6.

Figure 31:
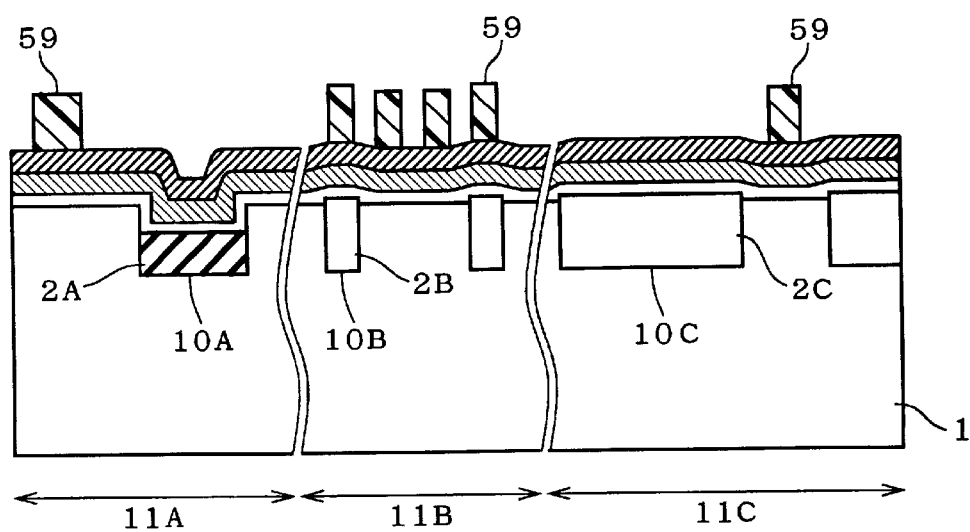

Following this, as shown in FIG. 31, using the alignment mark (the silicon oxide film 2A within the trench 10A) formed at the element isolation step, by a photolithographic technology, a resist pattern 59 is formed which is used to align the element isolation region to a gate electrode.

Figure 32:
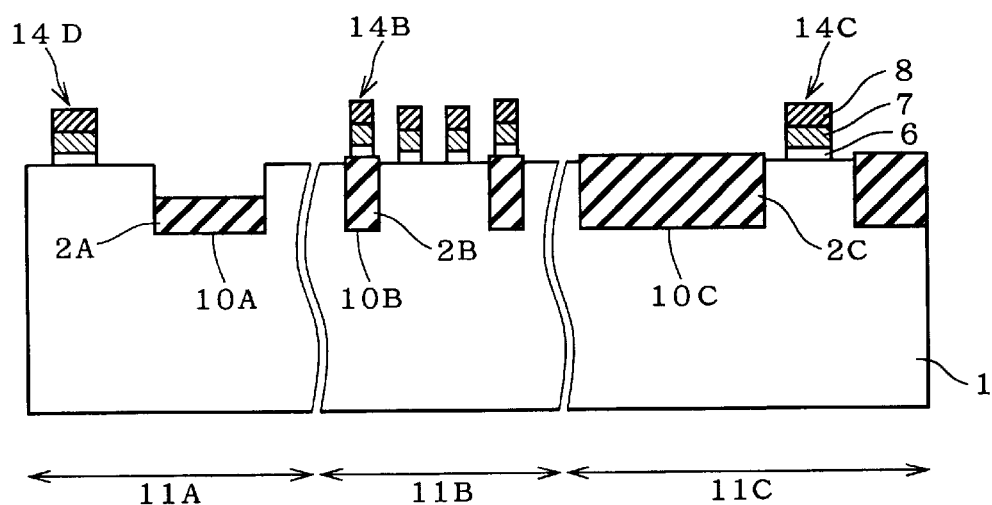

Next, as shown in FIG. 32, using the resist pattern 59 as a mask, the tungsten silicide film 8 and the polysilicon film 7 are removed by dry etching, thereby forming the gate electrode portions 14D, 14B and 14C in the alignment mark area 11A, the memory cell area 11B and the peripheral circuit area 11C, respectively.

Figure 33:
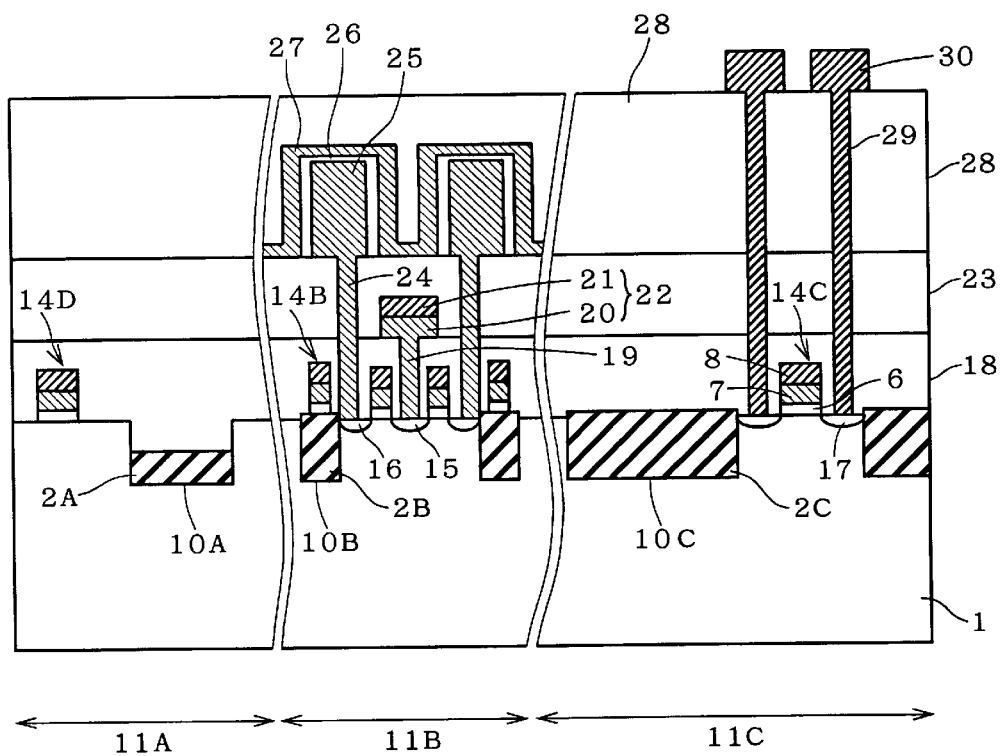
FIG. 33 is a cross sectional view of a semiconductor device which is formed by an improved method, which is principle of the present invention.

FIG. 33 is a cross sectional view showing a structure of a DRAM which is fabricated by executing further steps after forming the gate electrode portion 14 which is shown in FIG. 32. In the following, a portion which is added to the structure which is shown in FIG. 32 will be described.

Diffusion regions 15 and 16 are formed adjacent to the gate electrode portion 14B within a surface of the memory cell area 11B of the silicon substrate 1, and a diffusion region 17 is formed adjacent to the gate electrode portion 14C within a surface of the peripheral circuit area 11C.

An inter-layer insulation film 18 is formed entirely over the silicon substrate 1, a contact hole 19 is formed penetrating the inter-layer insulation film 18 on the diffusion region 15, and a bit line 22 which is electrically connected to the diffusion region 15 through the contact hole 19 is formed on a portion of the inter-layer insulation film 18 and within the contact hole 19. The bit line 22 is formed by a polysilicon film 20 and a titanium silicide film 21.

As described later, during photolithography for forming the contact hole 19, a dummy gate electrode portion 14D which is formed in the alignment mark area 11A is used as an alignment mark for alignment.

An inter-layer insulation film 23 is formed covering the bit line 22 on the inter-layer insulation film 18, a contact hole 24 is formed penetrating the inter-layer insulation films 18 and 23 on the diffusion region 16, and a storage node 25 which is electrically connected to the diffusion region 16 through the contact hole 24 is formed on a portion of the inter-layer insulation film 23 and within the contact hole 24.

During photolithography for forming the contact hole 24 for storage node contact as well, as described later, alignment is performed using the dummy gate electrode portion 14D as an alignment mark. A cell plate electrode 27 is formed on the storage node 25 through a capacitor insulation film 26.

An inter-layer insulation film 28 is formed covering the storage node 25, the capacitor insulation film 26 and the diffusion region 17 on the inter-layer insulation film 23. A contact hole 29 is formed penetrating the inter-layer insulation films 18, 23 and 28 on the diffusion region 17, and an Al wire layer 30 which is electrically connected to the diffusion region 17 through the contact hole 29 is formed on a portion of the inter-layer insulation film 28 and within the contact hole 29.

During photolithography for forming the contact hole 29 which is used to form the Al wire layer 30 as well, as described later, alignment is performed using the dummy gate electrode portion 14D as an alignment mark.

Now, a method of manufacturing a dynamic RAM which has the structure which is shown in FIG. 33 will be described. First, the gate electrode portions 14B to 14D are formed as shown in FIG. 32, by the manufacturing method which is shown in FIGS. 26 to 32. Manufacturing steps shown in FIGS. 34 to 37 are subsequently carried out.

Figure 34:
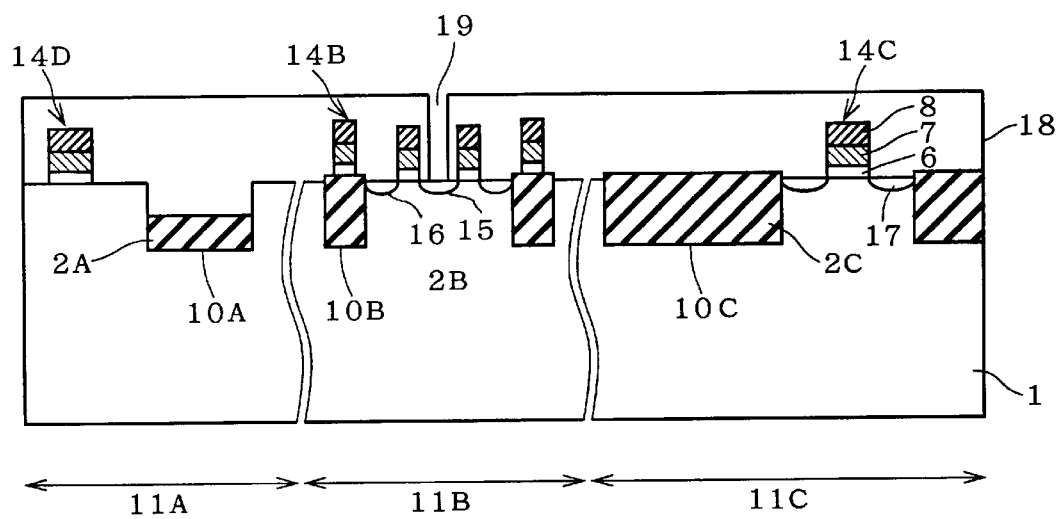
FIGS. 34 to 37 are cross sectional views showing a method of manufacturing the semiconductor device of FIG. 33.

First, after forming the diffusion regions 15 to 17 by ion implantation, as shown in FIG. 34, the inter-layer insulation film 18 is formed entirely over the gate electrode portions 14B to 14D by the CVD method, a pattern to which the contact hole 19 is aligned is formed on the diffusion region 15 of the gate electrode portion 14B by a photolithographic technique using the dummy gate electrode portion 14D as an alignment mark, and the contact hole 19 is opened penetrating the inter-layer insulation film 18 on the diffusion region 15 by dry etching.

Following this, the polysilicon film 20 and the titanium silicide film 21 which are doped with phosphorus are formed in this order, the bit line 22 is formed by a photolithographic technique and dry etching, and the second inter-layer insulation film 23 is formed by the CVD method.

Figure 35:
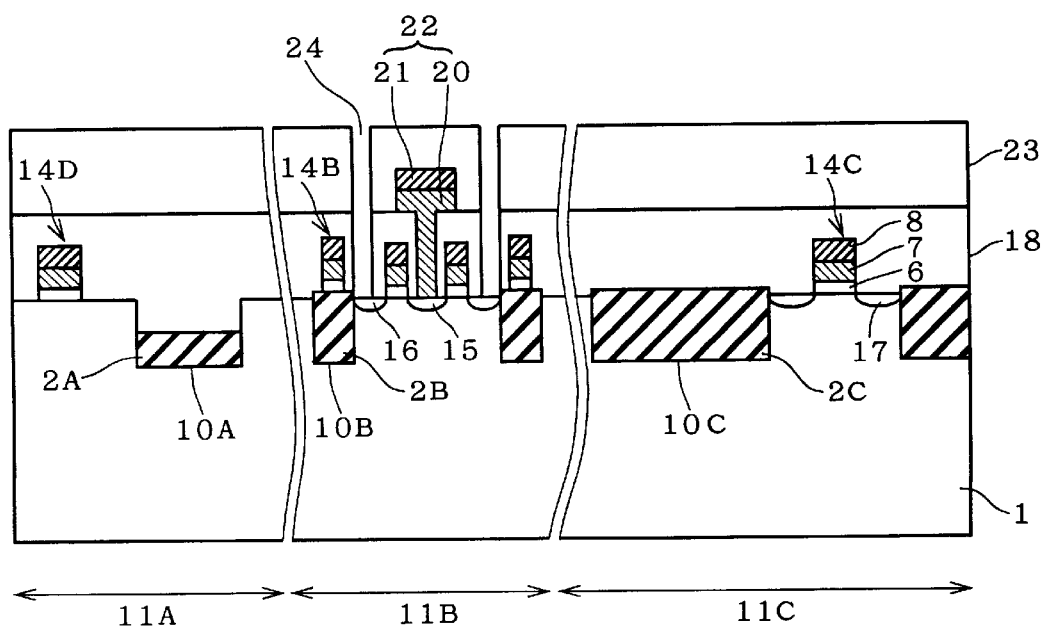

Next, as shown in FIG. 35, a pattern to which the contact hole 24 is aligned is formed on the diffusion region 16 of the gate electrode portion 14B by a photolithographic technique using the dummy gate electrode portion 14D as an alignment mark, and the contact hole 24 is opened penetrating the inter-layer insulation films 18 and 23 on the diffusion region 16 by dry etching. A phosphorus-doped polysilicon film is thereafter formed, the storage node 25 is formed by a photolithographic technology and dry etching, the capacitor insulation film 26 is formed covering the storage node 25, a polysilicon film whose entire surface is doped with phosphorus is formed by the CVD method, and the cell plate electrode 27 is formed by a photolithographic technology and dry etching.

Figure 36:
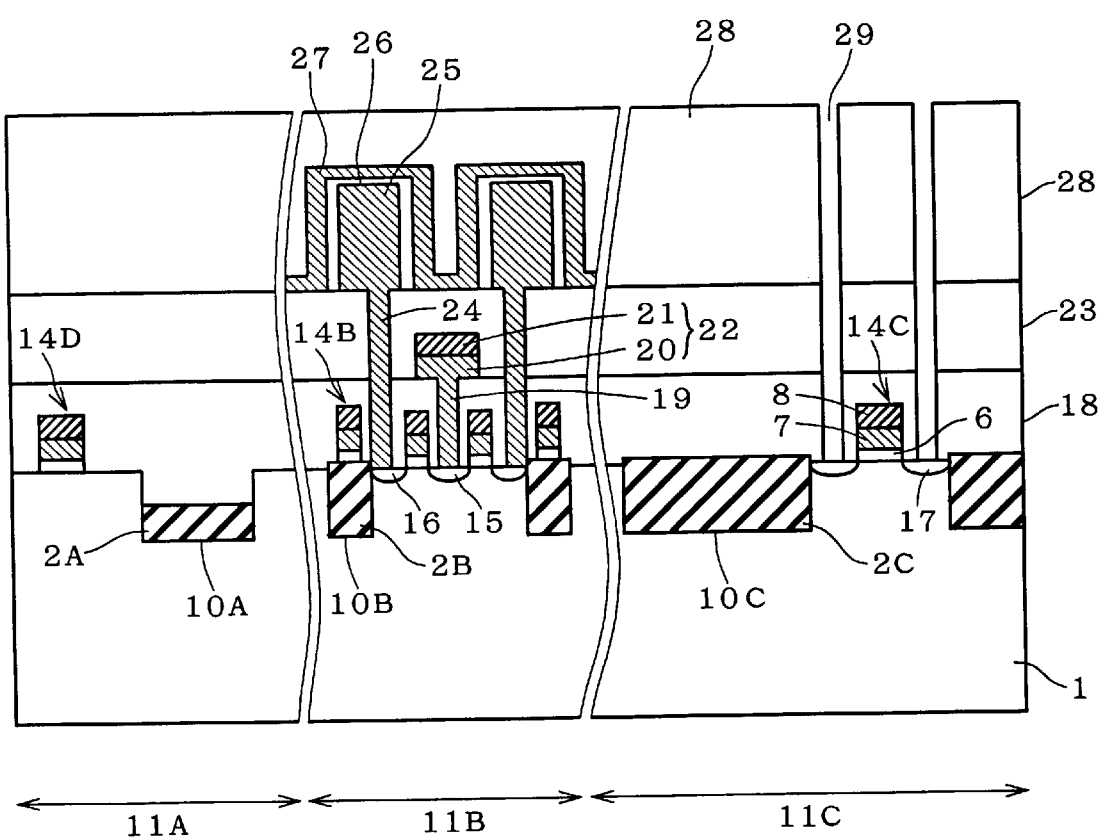

Next, as shown in FIG. 36, the inter-layer insulation film 28 is formed by the CVD method, a pattern to which the contact hole 29 is aligned is formed on the diffusion region 17 and the like of the gate electrode portion 14C by a photolithographic technology using the dummy gate electrode portion 14D as an alignment mark, and the contact hole 29 is opened penetrating the inter-layer insulation films 18, 23 and 28 on the diffusion region 17 and the like by dry etching.

Figure 37:
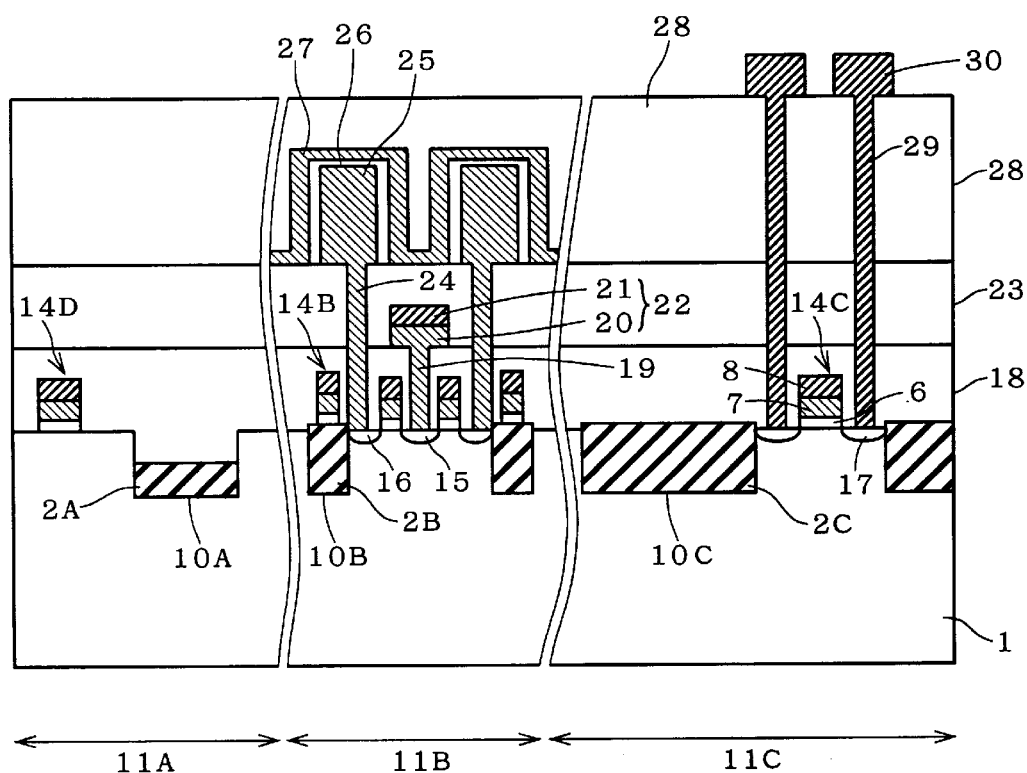

Following this, as shown in FIG. 37, an Al wire is deposited by sputtering and a wire layer is formed by a photolithographic technology and dry etching.

In this manner, for more accurate alignment to the gate electrode portions 14B to 14D, a height difference is set between surface of the silicon oxide film 2A, which is formed within the trench 10A of the alignment mark area 11A, and the surface of the silicon substrate 1.

Figure 38:
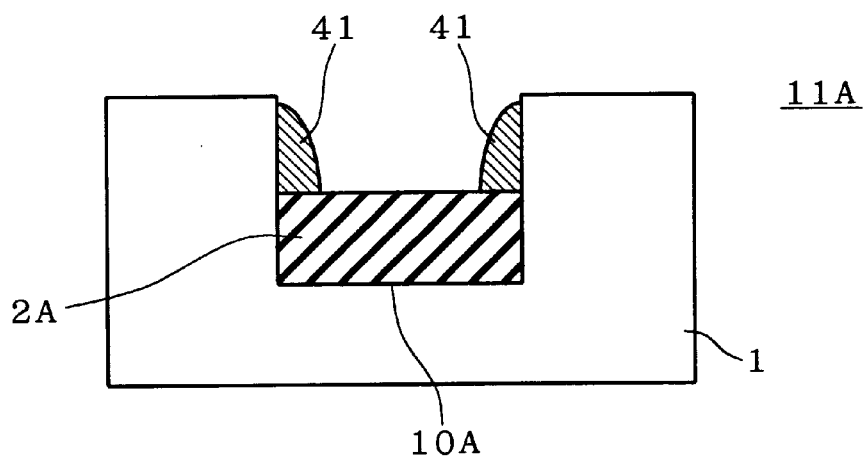
FIGS. 38 and 39 are explanatory diagrams showing a problem with the improved method.

However, in this structure, during formation of the polysilicon film 7 and the tungsten silicide film 8 which are the gate electrode materials, the film thickness of the gate electrode materials is large at the edge portion of the trench 10A, and therefore, as shown in FIG. 38, an etching remainder 41 of the gate electrode materials is created in the edge proximity region of the trench 10A when the gate electrode portions 14B to 14D are etched. Since the etching remainder 41 easily peels off and moves closer to the element formation region (i.e., the memory cell area 11B and the peripheral circuit area 11C) at a later stage, the etching remainder 41 short-circuits wires and degrades a yield of the elements.

Further, in the improved method above, the contact hole 19 for contact with the bit line, the contact hole 24 for storage contact, and the contact hole 29 for the Al wire are formed by photolithography while aligning the gate electrode portion 14B, which is formed in the alignment mark area 11A, as an alignment mark. Although this allows to align to the gate electrode portions 14B and 14C accurately, with respect to alignment of an isolation region (i.e., the silicon oxide films 2B and 2C) or the active regions 15 to 17, since the alignment is indirect alignment, an alignment error is large.

Now, indirect alignment will be described. Alignment to the dummy gate electrode portion 14D is performed using the silicon oxide film 2A which is formed within the trench 10A as an alignment mark (first alignment). Further, alignment to the contact holes 19, 24 and 29 is performed using the dummy gate electrode portion 14D as an alignment mark (second alignment). Hence, an alignment error from the isolation region (i.e., the silicon oxide films 2B and 2C) or the active regions 15 to 17 is a total of positional errors which are created as a result of the first and the second alignments (where a standard deviation of a random error which is created in the first and the second alignments is α), which is a standard deviation (√2·α) which is obtained by adding the first and the second alignments together. Thus, the alignment error is at an intolerable level.

Figure 39:
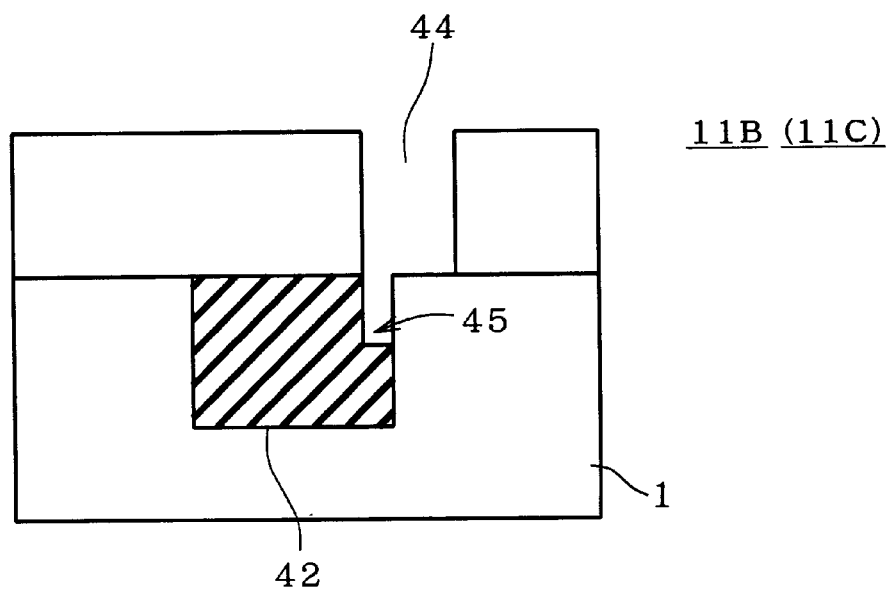
Figure 40:
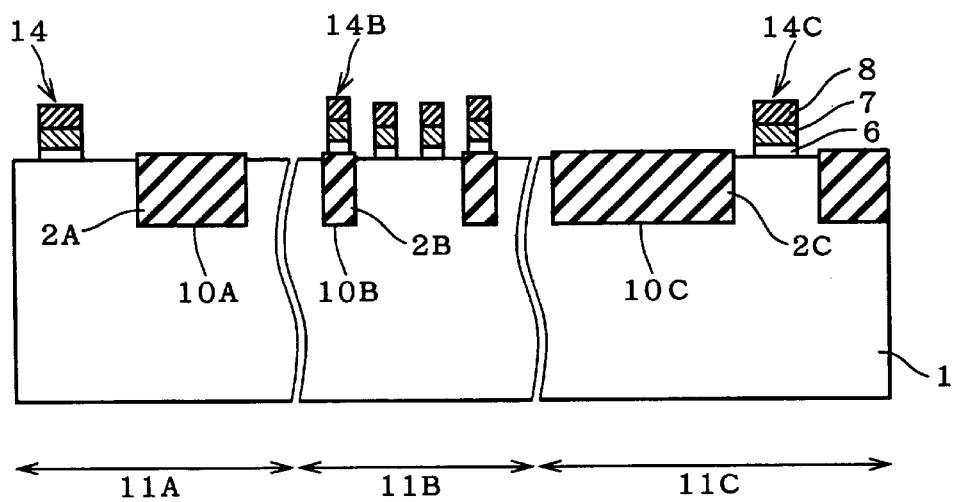
FIG. 40 is a cross sectional view of a cross sectional structure of a conventional semiconductor device (DRAM)
Figure 41:
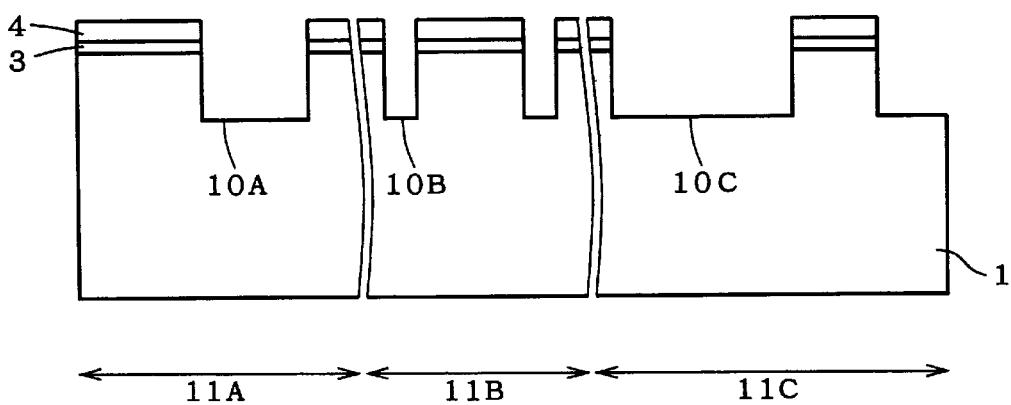
FIGS. 41 to 47 are cross sectional views showing a method of manufacturing the conventional semiconductor device.
Figure 42:
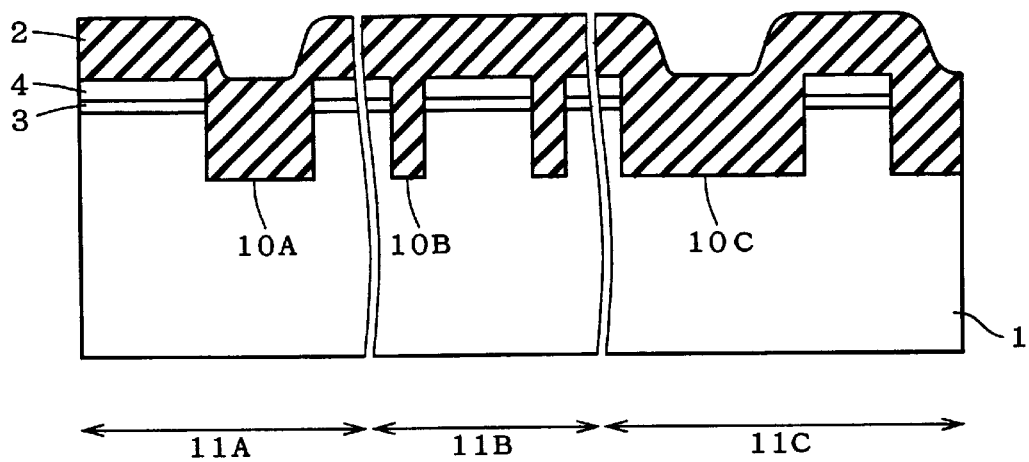
Figure 43:
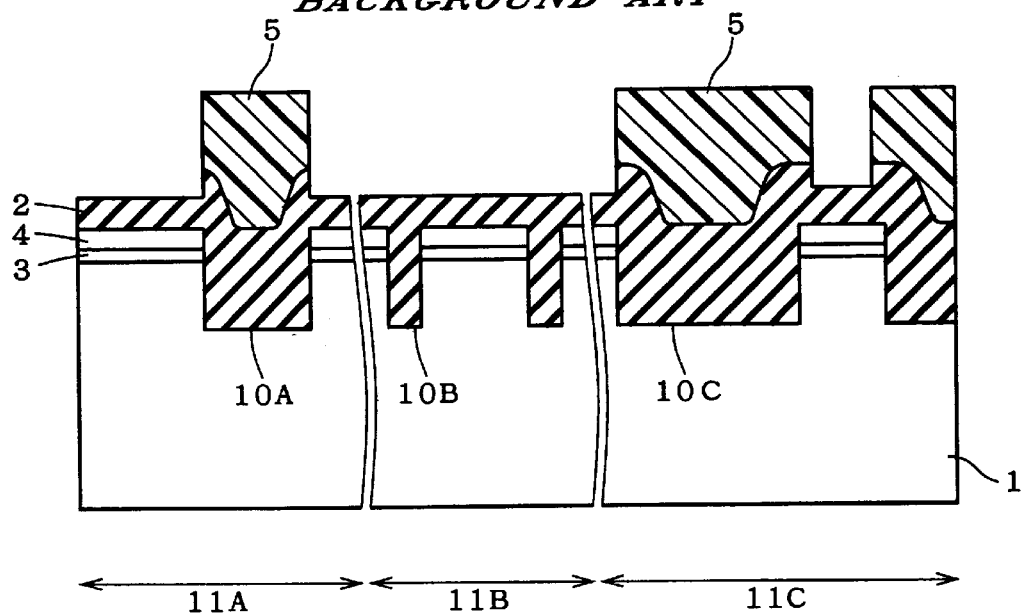
Figure 44:
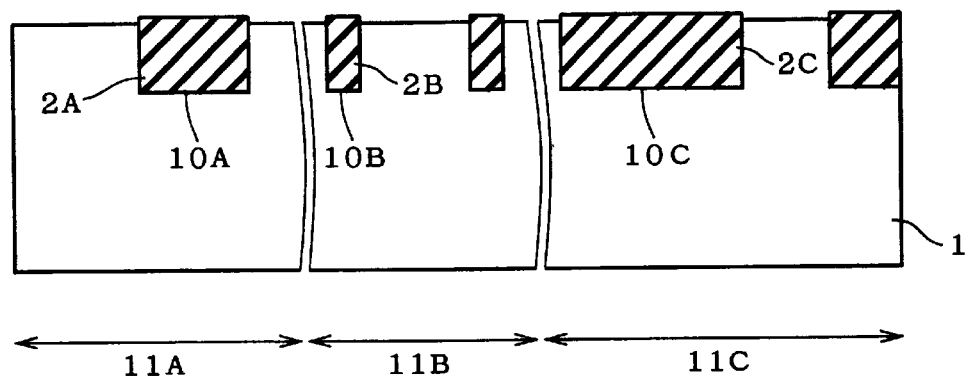
Figure 45:
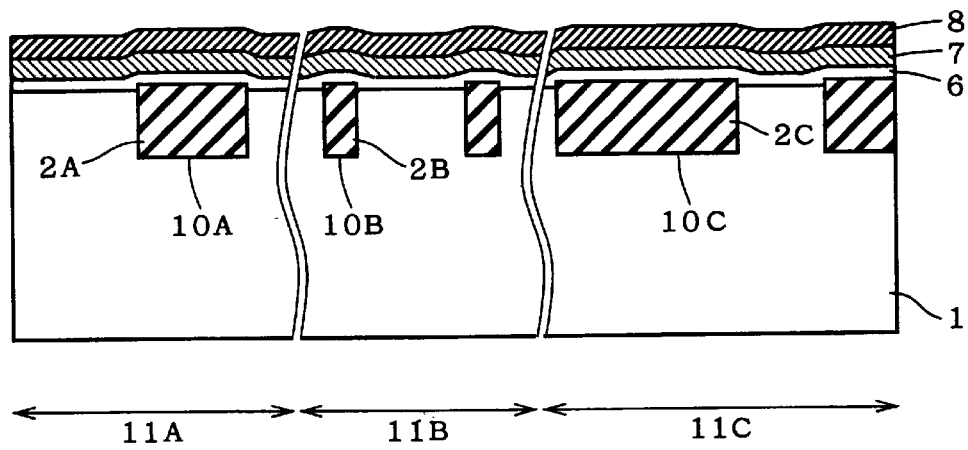
Figure 46:
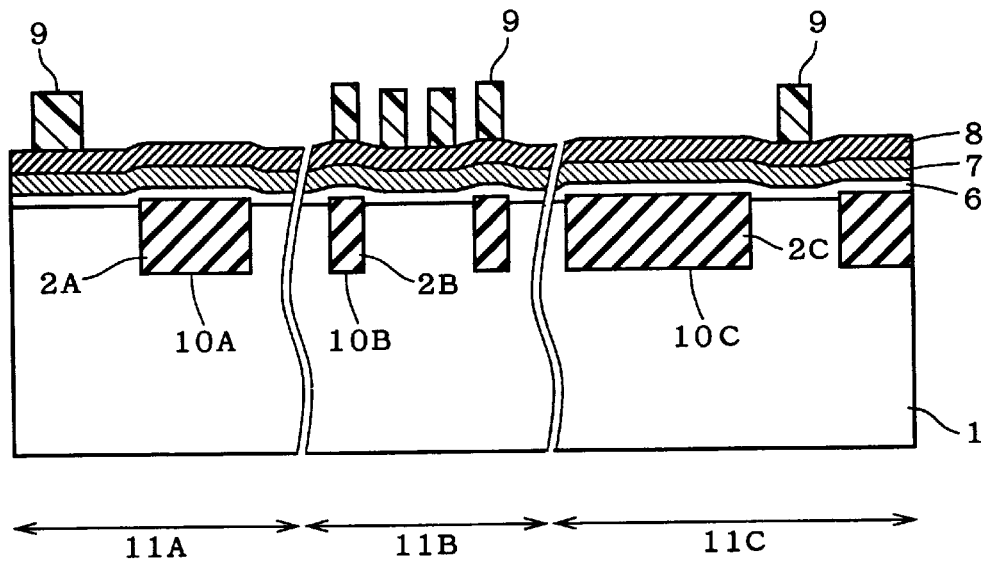
Figure 47:
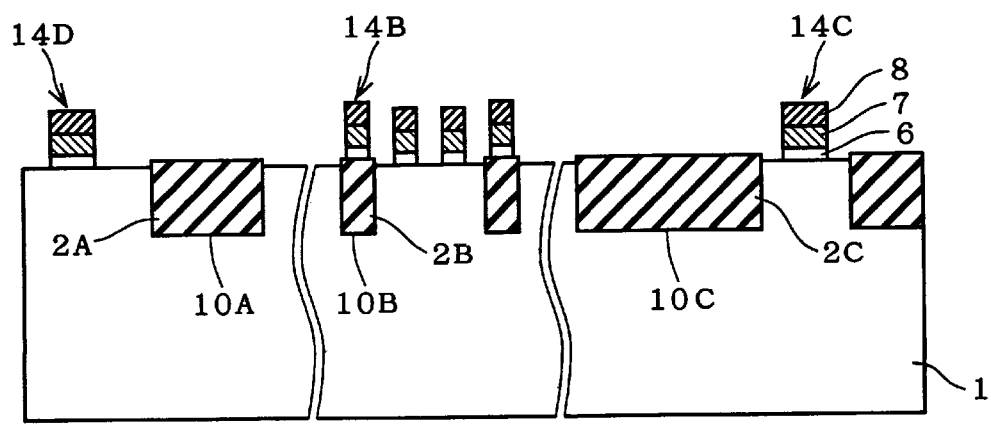

As shown in FIG. 39, the positional errors above may allow a contact hole 44 (which corresponds to the contact holes 19, 24 and 29) to be erroneously formed which penetrates an inter-layer insulation film 43 (which corresponds to the inter-layer insulation films 18, 23 and 29) on a portion of an element isolation silicon oxide film 42 (which corresponds to the silicon oxide films 2B and 2C) of the memory cell area 11B (the peripheral circuit area 11C). If this occurs, since the inter-layer insulation film 43 is the same oxide film as the element isolation silicon oxide film 42, during etching, the element isolation silicon oxide film 42 within the trench is also removed, and an abnormally deepened region 45 is accordingly formed, which leads to a damage during formation of the contact hole 44 and deteriorates a junction characteristic with an active region.

While the problem described above may be avoided if the silicon oxide film 2A is used as an alignment mark during alignment for forming the contact hole, since the inter-layer insulation film 43 is flattened, a preliminary height difference between the surface of the silicon oxide film 2A and the surface of the silicon substrate 1 is not reflected well to a surface of the inter-layer insulation film 43, and therefore, it is difficult to detect the mark. In addition, since the inter-layer insulation film 43 and the silicon oxide film 2A are films of the same type, a film thickness difference between these films does not make it easy to detect the mark and align accurately. Thus, this solution is not practical.

Meanwhile, the present invention is a further improvement of the improved method which has such problems above. Accordingly, a first object of the present invention is to achieve a high yield of integrated circuits by leaving a first wire material at least in the edge portion of the trench 10A of the alignment mark area 11A which defines the position of the active region and accordingly suppressing creation of an etching remainder.

Further, the first wire material is left entirely on the alignment mark which is formed by the silicon oxide film 2A and the trench 10A of the alignment mark area 11A which defines the position of the active region, so that the preliminary height different due to the alignment mark which defines the position of the active region is reflected as a height difference in a surface of the first wire material which is formed on the alignment mark. Using the height difference as an alignment mark, alignment of the contact holes for contact with the Al wire, the bit line and the storage node is performed, thereby aligning the contact holes to the active region accurately and reducing a deterioration of junctions. This is a second object of the present invention.

First Preferred Embodiment

Figure 1:
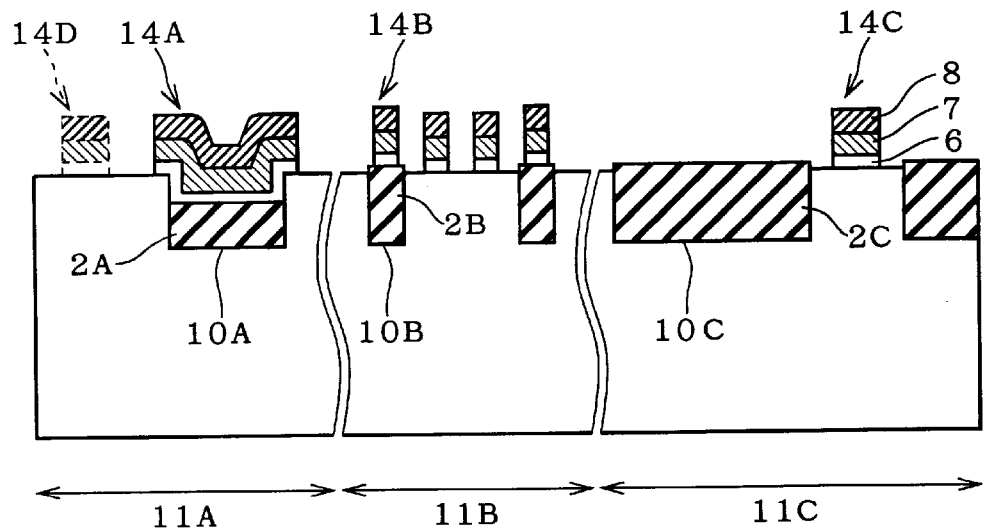
FIG. 1 is a cross sectional view of a semiconductor device (DRAM) according to a first preferred embodiment of the present invention.
Figure 2:
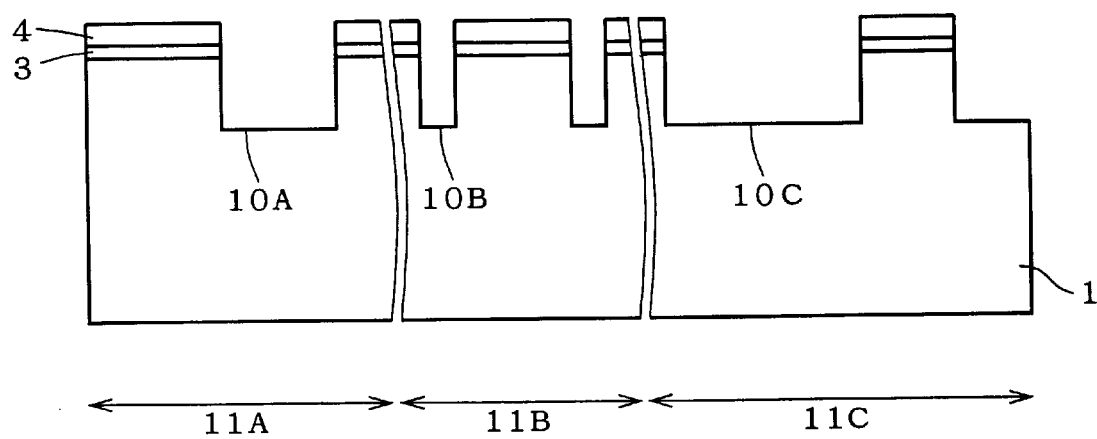
FIGS. 2 to 8 are cross sectional views showing, a method of manufacturing the semiconductor device according to the first preferred embodiment.

FIG. 1 is a cross sectional view of a semiconductor device (DRAM) according to a first preferred embodiment of the present invention. Shown in FIG. 1 is a cross sectional structure of a semiconductor device as it is after the silicon oxide films 2A to 2C which are a trench-type element isolation region are formed and the gate electrode portions 14A to 14C (14D) are patterned.

As shown in FIG. 1, the trenches 10A, 10B and 10C are formed respectively in the alignment mark area 11A, the memory cell area 11B and the peripheral circuit area 11C of the silicon substrate 1, and the silicon oxide films 2A to 2C are buried in the trenches 10A to 10C. While the surface of the silicon oxide film 2 within the trenches 10B and 10C of the element formation region (i.e., the memory cell area 11B and the peripheral circuit area 11C) in the silicon substrate 1 is approximately at the same height as the surface of the silicon substrate 1, the height of the surface of the silicon oxide film 2 within the trench 10A of the alignment mark area 11A is lower than the height of the surface of the silicon substrate 1. In addition, the gate electrode portions 14B and 14C are formed in the memory cell area 11B and the peripheral circuit area 11C, respectively.

Further, the gate oxide film 6, the polysilicon film 7 and the tungsten silicide film 8 are deposited covering the trench 10A including the surface of the silicon oxide film 2A, whereby the dummy gate electrode portion 14A is formed. As denoted at the dotted line in FIG. 1, the dummy gate electrode portion 14D may be formed in a predetermined region other than the trench 10A of the alignment mark area 11A.

As shown in FIG. 1, the dummy gate electrode portion 14A, which is comprised of the gate oxide film 6, the polysilicon film 7 and the tungsten silicide film 8, is formed in the edge proximity region of the trench 10A, so that a structure which prevents an etching remainder is formed. This attains the first object of the present invention to suppresses a deterioration in a yield associated with an etching remainder.

FIGS. 2 to 8 are cross sectional views showing a method of manufacturing the semiconductor device which has a structure shown in FIG. 1. In the following, the manufacturing method will be described with reference to FIGS. 2 to 8.

After forming the silicon oxide film 3 into a thickness of 100 to 500 angstroms, the silicon nitride film 4 into a thickness of 1,000 to 3,000 angstroms on the silicon substrate 1, by a photolithographic technology and dry etching, the silicon nitride film 4 and the silicon oxide film 3 in the predetermined region and the silicon substrate 1 are etched to a depth of about 2,000 to 4,000 angstroms, thereby forming the trenches 10A, 10B and 10C of the predetermined depth are formed in the silicon substrate 1.

Figure 3:
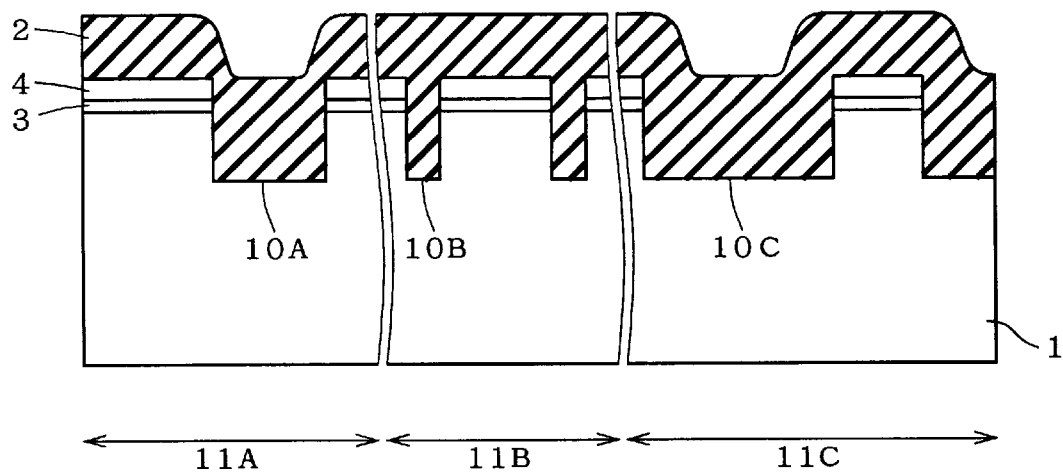

Following this, as shown in FIG. 3, after forming an oxide film of about 100 to 300 angstroms in side surfaces and bottom surfaces of the trenches 10A, 10B and 10C by thermal oxidation, the silicon oxide film 2 is deposited into a thickness of 5,000 to 1,000 angstroms by the CVD method. At this stage, since the silicon oxide film 2 is buried in the narrow trench 10B during an initial stage of the deposition while the silicon oxide film 2 is deposited into a film thickness which is equal to the deposited film thickness within the wide trenches 10A and 10C, a film thickness of the silicon oxide film 2 as viewed from the bottom of the trench 10B is thicker than the film thickness in the alignment mark area 11A and the peripheral circuit area 11C. As a result, an on-the-trench silicon oxide film thickness difference is created.

Figure 4:
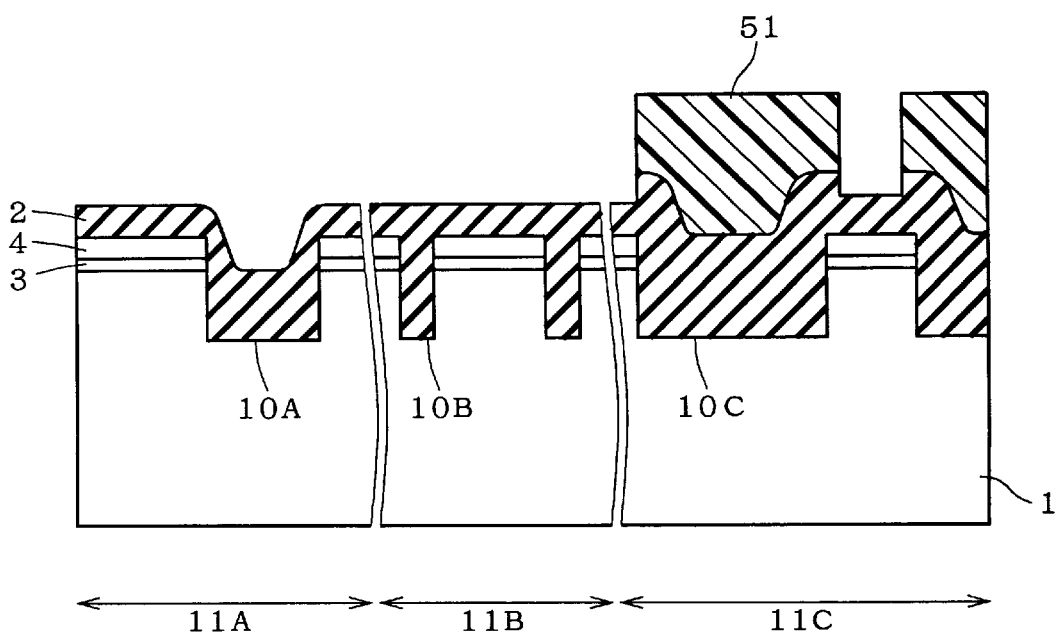

Next, as shown in FIG. 4, to reduce the on-the-trench silicon oxide film thickness difference, the resist pattern 51 is formed on the buried silicon oxide film 2 on the trench 10C by photolithography, and the silicon oxide film 2 is partially removed by dry etching.

At this stage, a portion of the silicon oxide film 2 on the trench 10A of the alignment mark area 11A is also removed, to thereby decrease the film thickness of the buried oxide film, in such a manner that the film thickness of the buried oxide film is 300 to 2,000 angstroms lower than the surface of the silicon substrate 1 after a CMP (Chemical Mechanical Polishing) process which will be described.

Figure 5:
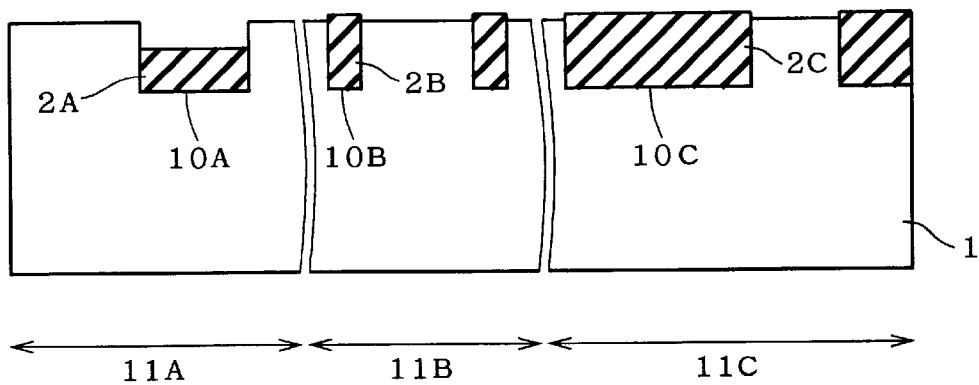

Following this, after removing the resist pattern 51, the entire surface is polished by the CMP method, thereby removing the silicon oxide film 2 on the silicon nitride film 4 and partially removing the silicon oxide film 2 on the trenches 10A to 10C. Next, The silicon nitride film 4 is removed using phosphoric acid and the silicon oxide film 3 is removed using hydrofluoric acid, thereby completing a trench-type element isolation structure as shown in FIG. 5. At this stage, while the surfaces of the silicon oxide films 2B and 2C in the trenches 10B and 10C of the element formation region are approximately at the same height as the surface of the silicon substrate 1, the height of the surface of the silicon oxide film 2A in the trench 10A of the alignment mark area 11A is 300 to 2,000 angstroms lower than the height of the surface of the silicon substrate 1. If the preliminary height difference between the surface of the silicon oxide film 2A and the surface of the silicon substrate 1 is set 30 nm or more in this manner, it is possible to obtain a sufficiently high alignment accuracy.

Figure 6:
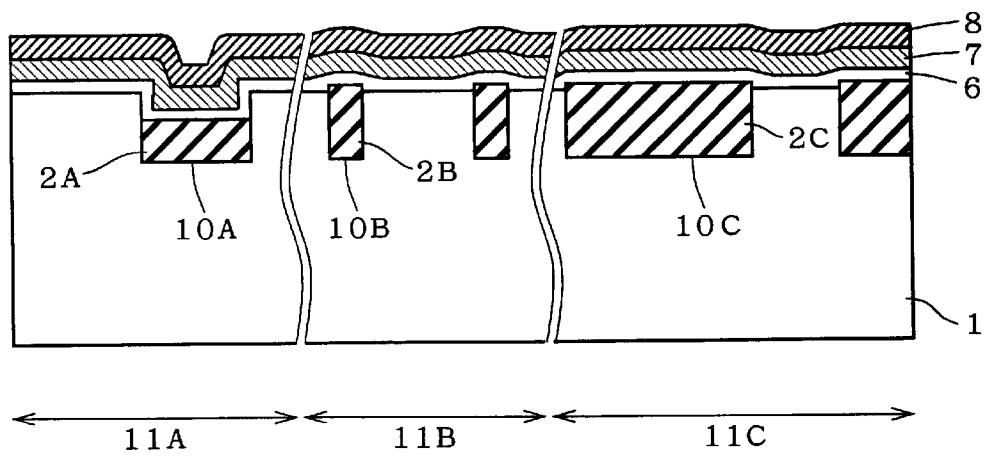

Next, the n-well and the p-well are formed by ion implantation. After ion implantation for controlling a threshold value of a field effective transistor, as shown in FIG. 6, the gate oxide film 6 is formed by thermal oxidation into a thickness of 40 to 100 angstroms, the phosphorus-doped polysilicon film 7 is deposited into a thickness of 300 to 1,500 angstroms by the CVD method on the gate oxide film 6, and the tungsten suicide film 8 is deposited by sputtering into a thickness of 300 to 1,500 angstroms.

Figure 7:
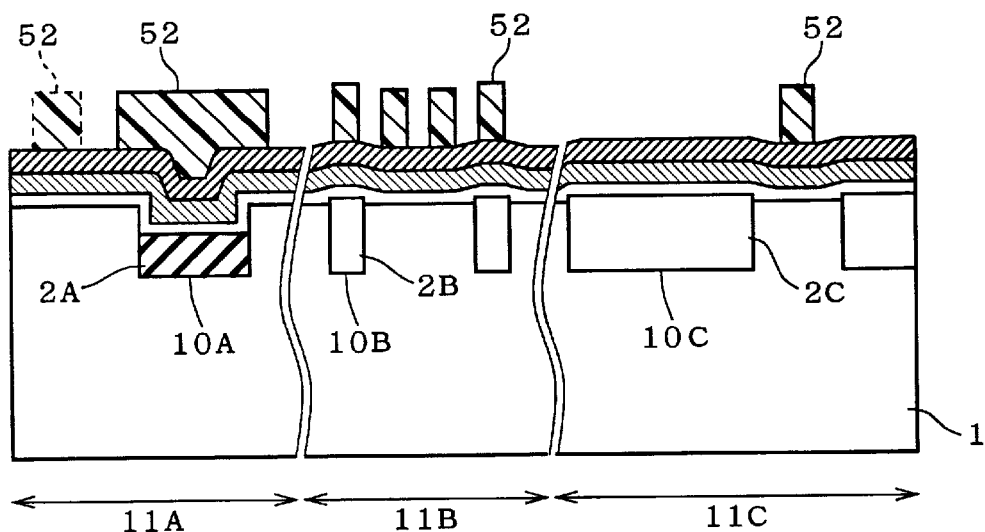

Following this, as shown in FIG. 7, using the alignment mark (the silicon oxide film 2A within the trench 10A) formed at the element isolation step, by a photolithographic technology, a resist pattern 52 is formed to which the gate electrode portions 14B and 14C are aligned are formed in the element isolation region. At this stage, the resist pattern 52 is formed also on the trench 10A of the alignment mark area 11A and a region around the same, in such a manner that an overlap from the edge portion of the trench 10A to the region around the edge portion is larger than an alignment error.

Figure 8:
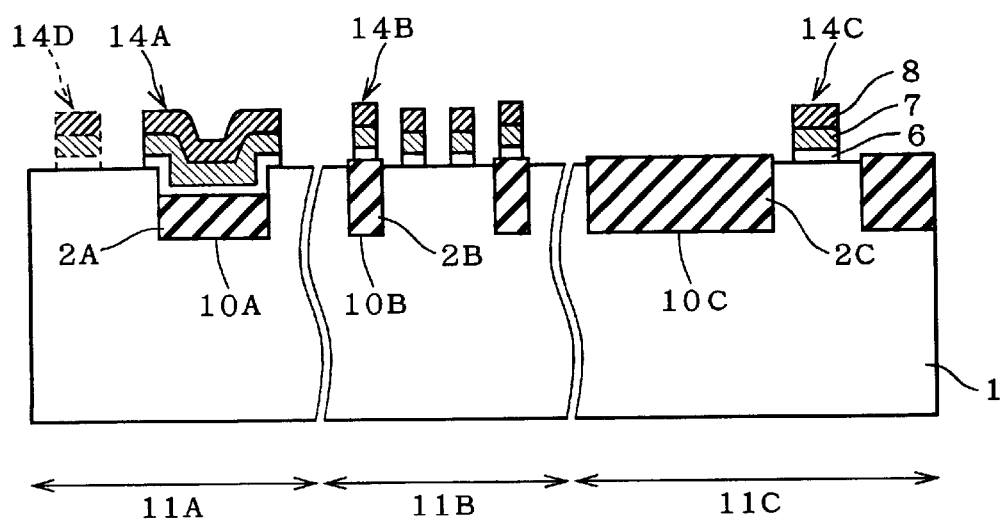

Next, as shown in FIG. 8, the tungsten silicide film 8 and the polysilicon film 7 are removed by dry etching using the resist pattern 52 as a mask, so that the gate electrode portions 14B and 14C are formed in the element isolation region. At the same time, the gate electrode material is left on the alignment mark area 11A as well, whereby the dummy gate electrode portion 14A is formed. The dummy gate electrode portion 14A prevents an etching remainder from remaining in the edge proximity region of the trench 10A. This achieves the first object to suppresses a deterioration in a yield associated with an etching remainder.

Since a stack structure of the polysilicon film 7 and the tungsten silicide film 8 does not transmit light, it is not possible to directly recognize the buried silicon oxide film 2A as an image during alignment. However, since the preliminary height difference between the surface of the buried silicon oxide film 2A and the surface of the silicon substrate 1 is reflected to the tungsten silicide film 8 which is formed above, it is possible to perform alignment accurately and form the gate electrode portions 14B and 14C by the first method which detects a mark using diffraction light or the second method which detects a mark by means of image recognition.

Although light is not transmitted similarly when the first wire material for forming the gate electrodes 14A to 14C is metal or a stack structure of polysilicon and metal, since the preliminary height difference between the surface of the buried silicon oxide film 2A and the surface of the silicon substrate 1 is reflected to the first wire material which is formed above, there is no problem.

Further, at the steps shown in FIGS. 7 and 8, the resist pattern 52 to which the dummy gate electrode portion 14D is aligned may be formed also on the predetermined region other than the trench 10A of the alignment mark area 11A as denoted at the dotted line in FIG. 7, and the dummy gate electrode portion 14D may be formed on the predetermined region other than the trench 10A of the alignment mark area 11A as denoted at the dotted line in FIG. 8.

A purpose of forming the dummy gate electrode portion 14D on the predetermined region other than the trench 10A of the alignment mark area 11A is to use the dummy gate electrode portion 14D as an alignment mark which is used to form the contact hole for contact with the active region as in the improved method which is shown in FIGS. 34 to 37. However, as described later in relation to a third preferred embodiment, since the dummy gate electrode portion 14A may be used as an alignment mark which is used to form the contact hole for contact with the active region, the dummy gate electrode portion 14D is neither indispensable nor essential.

While the foregoing has described the gate electrode material as a stacked film of the tungsten suicide film and the polysilicon film, it is clear that a similar effect is achieved even if other material is used.

Second Preferred Embodiment

Figure 9:
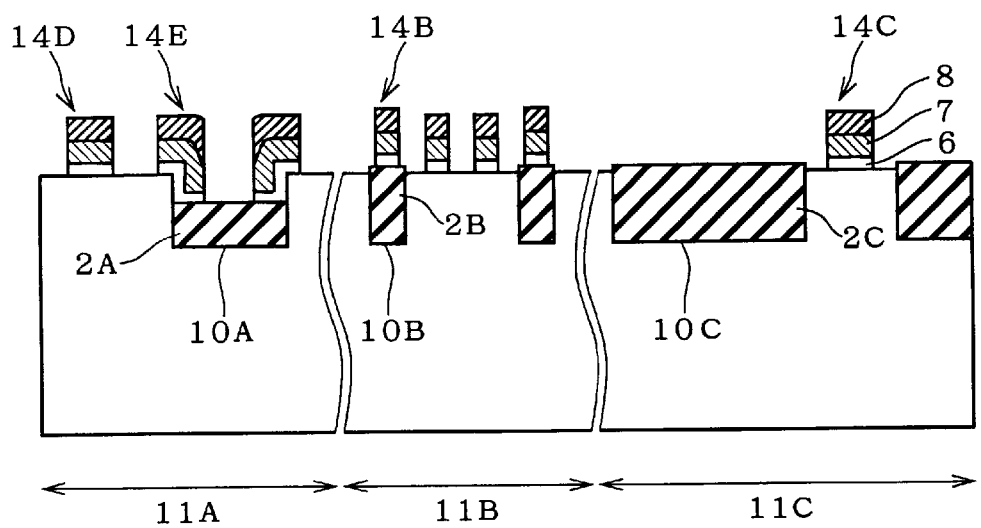
FIG. 9 is a cross sectional view of a semiconductor device (DRAM) according to a second preferred embodiment of the present invention.
Figure 10:
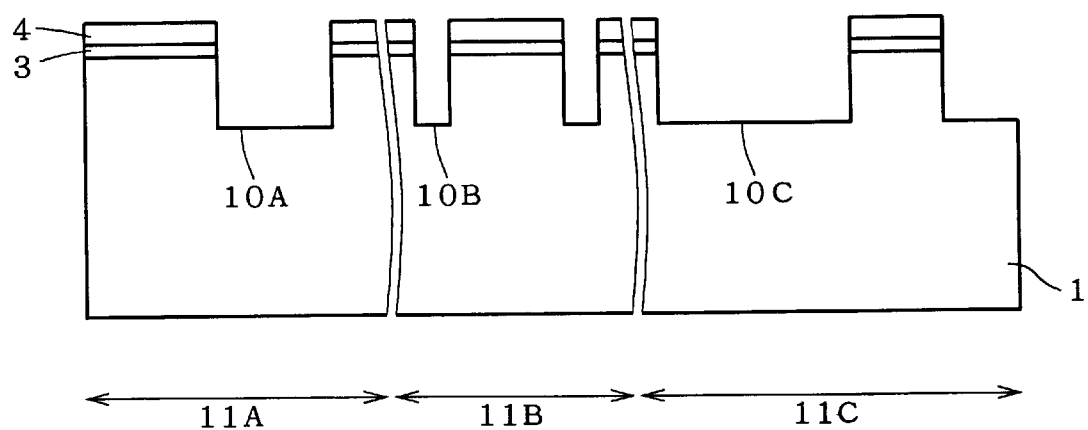
FIGS. 10 to 16 are cross sectional views showing a method of manufacturing the semiconductor device according to the second preferred embodiment.
Figure 11:
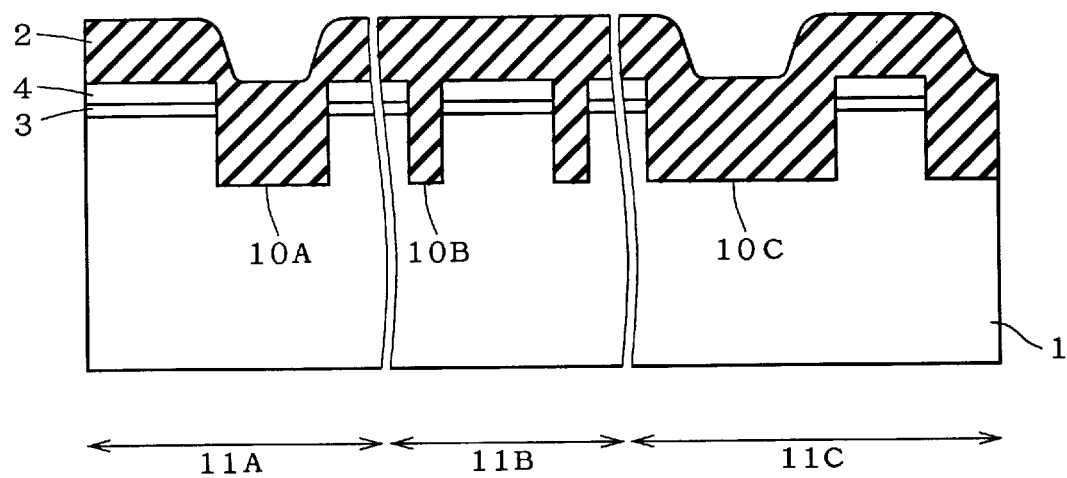
Figure 12:
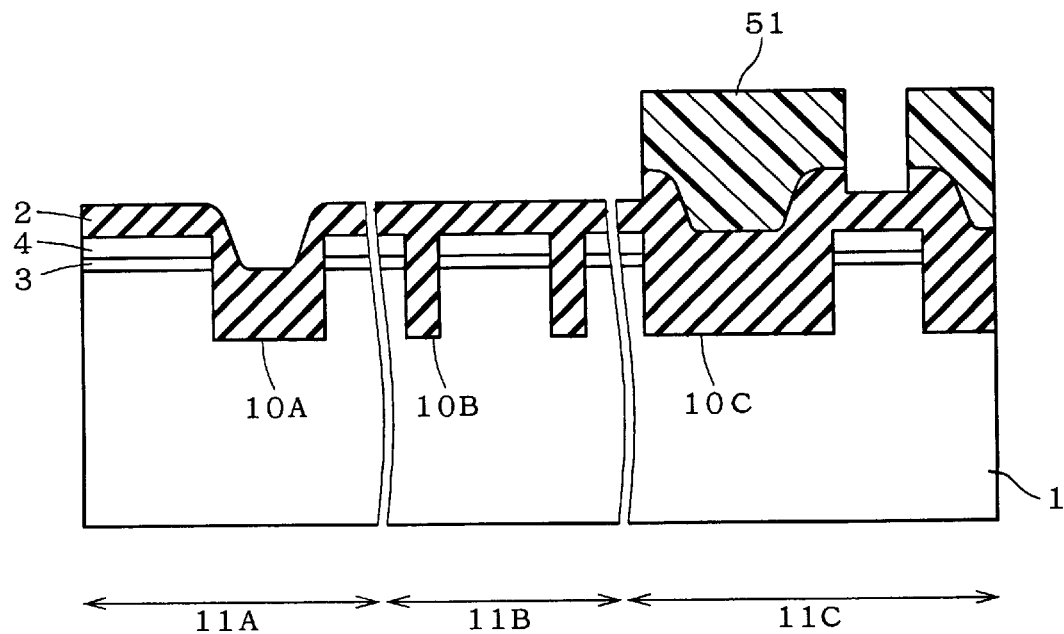
Figure 13:
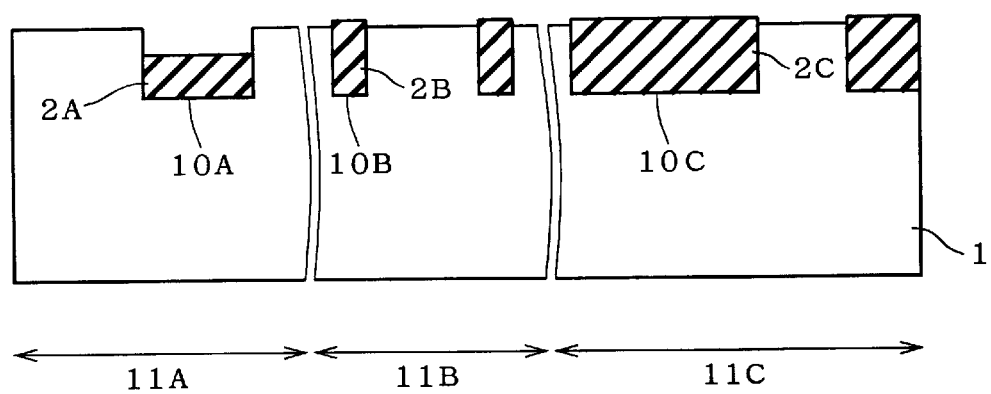

FIG. 9 is a cross sectional view showing a structure of a semiconductor device (DRAM) according to a second preferred embodiment. Shown in FIG. 9 is a cross sectional structure of a semiconductor device as it is after the silicon oxide films 2A to 2C which are a trench-type element isolation region are formed and the gate electrode portions 14B, 14C, 14E (14D) are patterned.

As shown in FIG. 9, the trenches 10A, 10B and 10C are formed respectively in the alignment mark area 11A, the memory cell area 11B and the peripheral circuit area 11C of the silicon substrate 1, and the silicon oxide films 2A to 2C are buried in the trenches 10A to 10C. While the surface of the silicon oxide film 2 within the trenches 10B and 10C of the element formation region (i.e., the memory cell area 11B and the peripheral circuit area 11C) in the silicon substrate 1 is approximately at the same, height as the surface of the silicon substrate 1, the height of the surface of the silicon oxide film 2 within the trench 10A of the alignment mark area 11A is lower than the height of the surface of the silicon substrate 1.

In addition, the gate oxide film 6, the polysilicon film 7 and the tungsten silicide film 8 are deposited covering only the edge proximity region of the trench 10A, whereby the dummy gate electrode portion 14E is formed.

As shown in FIG. 9, since the dummy gate electrode portion 14E, which is comprised of the gate oxide film 6, the polysilicon film 7 and the tungsten silicide film 8, is formed in the edge proximity region of the trench 10A, so that a structure which prevents an etching remainder is formed. This attains the first object of the present invention to suppresses a deterioration in a yield associated with an etching remainder.

FIGS. 10 to 16 are cross sectional views showing a method of manufacturing the semiconductor device which has a structure shown in FIG. 1. In the following, the manufacturing method will be described with reference to FIGS. 10 to 16. Steps shown in FIGS. 10 to 14 are the same as the steps which are shown in FIGS. 2 to 6 related to the first preferred embodiment, and therefore, will not be described.

Figure 14:
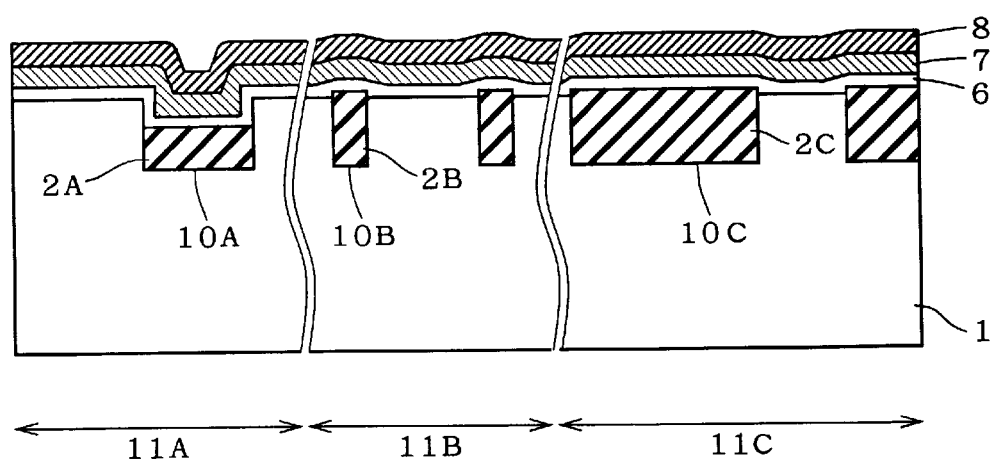
Figure 15:
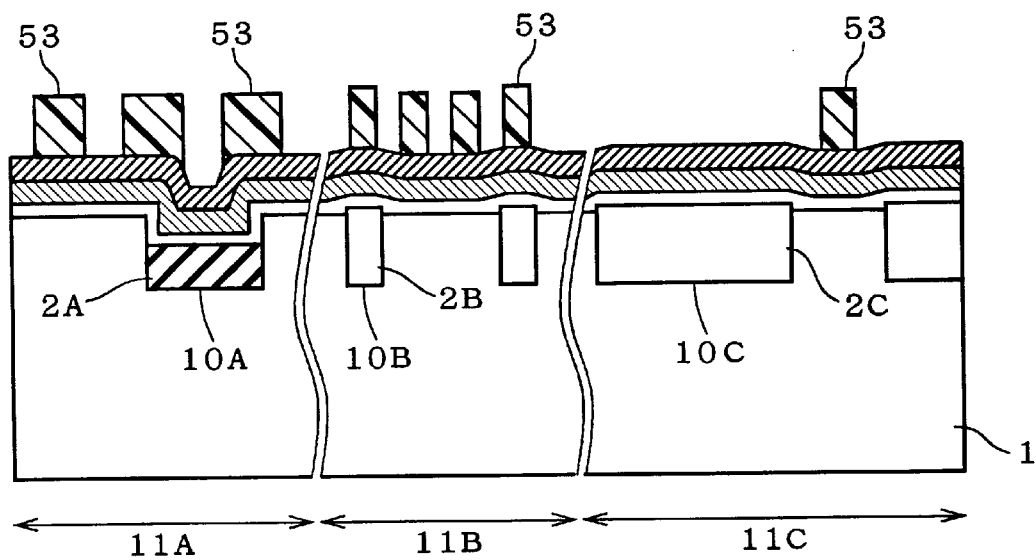

After obtaining the structure which is shown in FIG. 14, as shown in FIG. 15, a resist pattern 53 to which the gate electrode portions 14B, 14C and 14D are aligned is formed in the element isolation region by photolithography using the alignment mark (the silicon oxide film 2A within the trench 10A) formed at the element isolation step. At this stage, the resist pattern 53 is formed also on the edge proximity region of the trench 10A, in such a manner that an overlap from the edge portion of the trench 10A to the region around the edge portion is larger than an alignment error.

Figure 16:
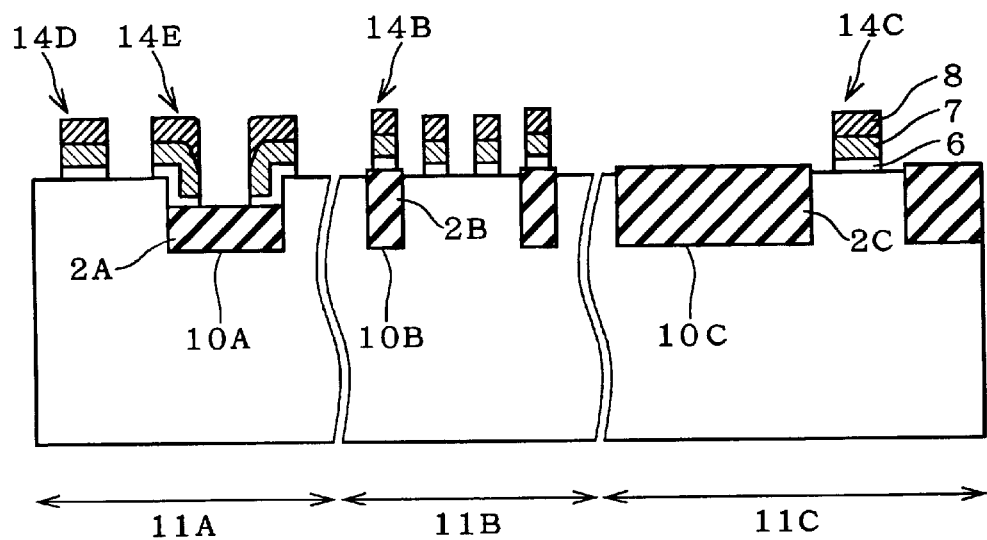

Next, as shown in FIG. 16, the tungsten silicide film 8 and the polysilicon film 7 are removed by dry etching using the resist pattern 53 as a mask, so that the gate electrode portions 14B to 14D are formed in the element isolation region. At the same time, the gate electrode material is left on the alignment mark area 11A as well, whereby the dummy gate electrode portion 14E is formed. The dummy gate electrode portion 14E prevents an etching remainder from remaining in the edge proximity region of the trench 10A. This achieves the first object to suppresses a deterioration in a yield associated with an etching remainder.

While the resist pattern 53 to which the gate electrode portion 14B is aligned is formed also on the predetermined region other than the trench 10A of the alignment mark area 11A and the dummy gate electrode portion 14D is formed on the predetermined region other than the trench 10A of the alignment mark area 11A at the steps which are shown in FIGS. 15 and 16, this is to use the dummy gate electrode portion 14D as an alignment mark which is used to form the contact hole for contact with the active region as in the improved method which is shown in FIGS. 34 to 37.

Although the foregoing has described the gate electrode material as a stacked film of the tungsten suicide film and the polysilicon film, it is clear that a similar effect is achieved even if other material is used.

Third Preferred Embodiment

Figure 17:
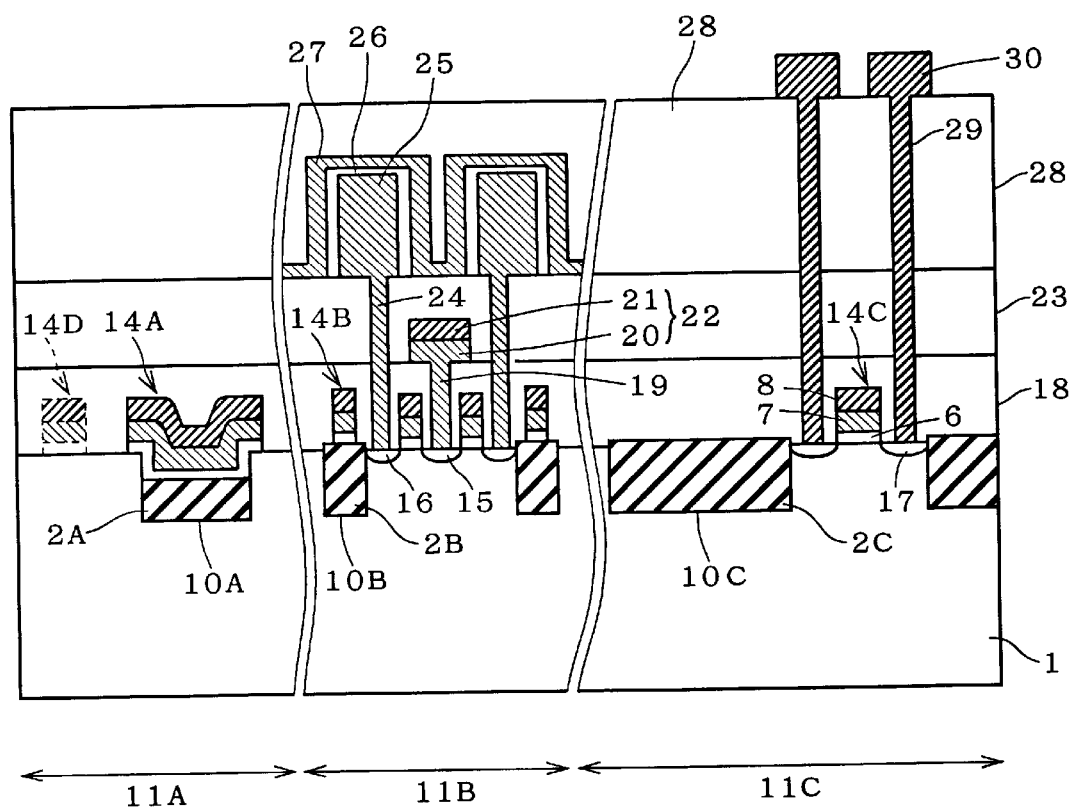
FIG. 17 is a cross sectional view of a semiconductor device (DRAM) according to a third preferred embodiment of the present invention.

FIG. 17 is a cross sectional view showing a structure of a DRAM according to a third preferred embodiment of the present invention. Shown in FIG. 17 is a cross sectional structure-of a DRAM which is fabricated by executing further steps after forming the gate electrode of the first preferred embodiment which is shown in FIG. 1. In the following, a portion which is added to the structure which is shown in FIG. 1 will be described.

In the surface of the memory cell area 11B of the silicon substrate 1, the diffusion regions 15 and 16 are formed adjacent to the gate electrode portion 14B. In the surface of the peripheral circuit area 11C, the diffusion region 17 is formed adjacent to the gate electrode portion 14C.

The inter-layer insulation film 18 is formed entirely on the silicon substrate 1, the contact hole 19 is formed penetrating the inter-layer insulation film 18 on the diffusion region 15, and the bit line 22 which is electrically connected to the diffusion region 15 through the contact hole 19 is formed on a portion of the inter-layer insulation film 18 and within the contact hole 19. The bit line 22 is formed by a polysilicon film 20 and a titanium silicide film 21.

As described later, during photolithography for forming the contact hole 19, alignment is performed using the dummy gate electrode portion 14A which is formed in the alignment mark area 11A as an alignment mark.

The inter-layer insulation film 23 is formed covering the bit line 22 on the inter-layer insulation film 18, the contact hole 24 is formed penetrating the inter-layer insulation films 18 and 23 on the diffusion region 16, and the storage node 25 which is electrically connected to the diffusion region 16 through the contact hole 24 is formed on a portion of the inter-layer insulation film 23 and within the contact hole 24.

During photolithography for forming the contact hole 24 for storage node contact as well, as described later, alignment is performed using the dummy gate electrode portion 14A as an alignment mark. The cell plate electrode 27 is formed on the storage node 25 through the capacitor insulation film 26.

On the inter-layer insulation film 23, the inter-layer insulation film 28 is formed covering the storage node 25, the capacitor insulation film 26 and the diffusion region 17. The contact hole 29 is formed penetrating the inter-layer insulation films 18, 23 and 28 on the diffusion region 17, and the A l wire layer 30 which is electrically connected to the diffusion region 17 through the contact hole 29 is formed on a portion of the inter-layer insulation film 28 and within the contact hole 29.

During photolithography for forming the contact hole 29 which is used to form the Al wire layer 30 as well, as described later, alignment is performed using the dummy gate electrode portion 14A as an alignment mark.

Now, a method of manufacturing a dynamic RAM which has the structure which is shown in FIG. 17 will be described. First, the gate electrode portions 14B to 14D are formed as shown in FIG. 8, by the manufacturing method according to the first preferred embodiment which is shown in FIGS. 2 to 8. A height difference is formed in the surface of the dummy gate electrode portion 14A on the silicon oxide films 2A within the trench 10A, in accordance with a preliminary height difference between the surface of the silicon oxide films 2A and the surface of the silicon substrate 1. Following this, manufacturing steps shown in FIGS. 18 to 21 are carried out.

Figure 18:
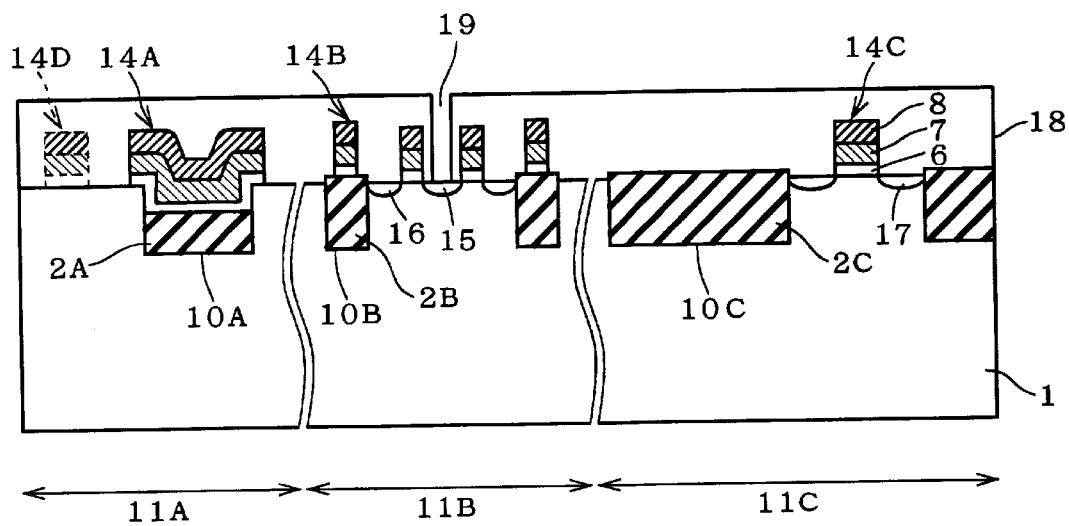
FIGS. 18 to 21 are cross sectional views showing a method of manufacturing the semiconductor device according to the third preferred embodiment.

After forming the diffusion regions 15 to 17 by ion implantation and subsequent diffusion, a silicon oxide film is deposited into a thickness of about 2,00 angstroms by the CVD method as shown in FIG. 18 to thereby form the inter-layer insulation film 18. While mark-detecting the height difference in the dummy gate electrode portion 14A using the dummy gate electrode portion 14A as an alignment mark, by photolithography, a pattern (not shown) to which the contact hole 19 is aligned is formed in the active region. By dry etching using the pattern as a mask, the contact hole 19 is opened penetrating the inter-layer insulation film 18 on the diffusion region 15.

Figure 19:
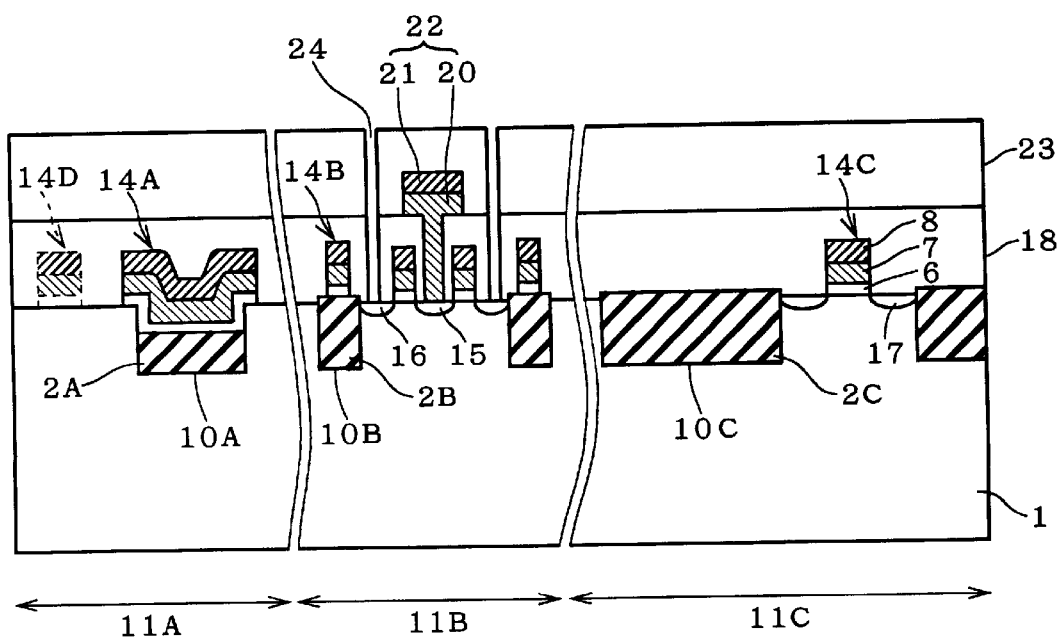

Following this, as shown in FIG. 19, the phosphorus-doped polysilicon film 20 having a thickness of about 800 angstroms and the titanium silicide film 21 having a thickness of about 800 angstroms are formed in this order. By photolithography and dry etching, the polysilicon film 20 and the titanium silicide film 21 are patterned, thereby forming the bit line 22. The bit line 22 is electrically connected to the diffusion region 15 through the contact hole 19.

A silicon oxide film having a thickness of about 500 angstroms and a silicon oxide film which is doped with boron and phosphorus and has a thickness of about 5,000 angstroms are deposited by the CVD method and flattened by thermally processing, whereby the inter-layer insulation film 23 is formed.

Next, as shown in FIG. 19, while mark-detecting the height difference in the dummy gate electrode portion 14A using the dummy gate electrode portion 14A as an alignment mark, by photolithography, a pattern (not shown) to which the contact hole 24 is aligned is formed in the active region. By dry etching using the pattern as a mask, the contact hole 24 is opened penetrating the inter-layer insulation films 18 and 23 on the diffusion region 16.

Figure 20:
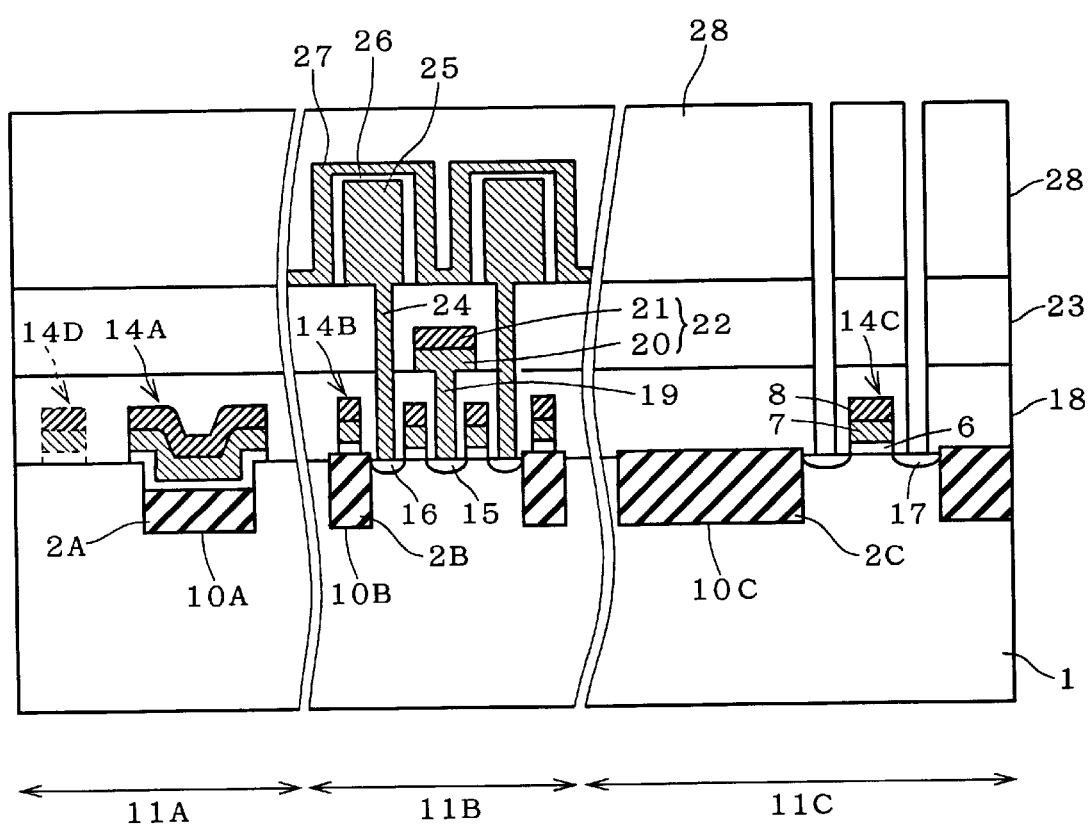

Next, as shown in FIG. 20, a phosphorus-doped polysilicon film having a thickness of about 8,000 angstroms is formed, and the storage node 25 is formed by photolithography and dry etching. The storage node 25 is electrically connected to the diffusion region 16 through the contact hole 24. Following this, a silicon nitride film having a thickness of about 50 angstroms is deposited and oxidized, thereby forming the capacitor insulation film 26 in such a manner that the capacitor insulation film 26 covers the storage node 25. A polysilicon film which is entirely doped with phosphorus and has a thickness of about 1,000 angstroms is formed by the CVD method, and the cell plate electrode 27 is formed by a photolithographic technology and dry etching.

Next, as shown in FIG. 20, a silicon oxide film having a thickness of about 500 angstroms and a silicon oxide film which is doped with boron and phosphorus and has a thickness of about 10,000 angstroms are deposited by the CVD method and flattened by thermally processing, and a silicon oxide film having a thickness of about 1,000 angstroms is deposited, thereby forming the inter-layer insulation film 28. While mark-detecting the height difference in the dummy gate electrode portion 14A using the dummy gate electrode portion 14A as an alignment mark, by photolithography, a pattern (not shown) to which the contact hole 29 is aligned is formed in the active region. By dry etching using the pattern as a mask, the contact hole 29 is opened (The contact hole 29 is on the diffusion region 17 in FIG. 20 for convenience of illustration.) penetrating the inter-layer insulation films 18, 23 and 28 on the diffusion region 17, the gate electrode 3, the bit line 22 and the cell plate electrode 27.

Figure 21:
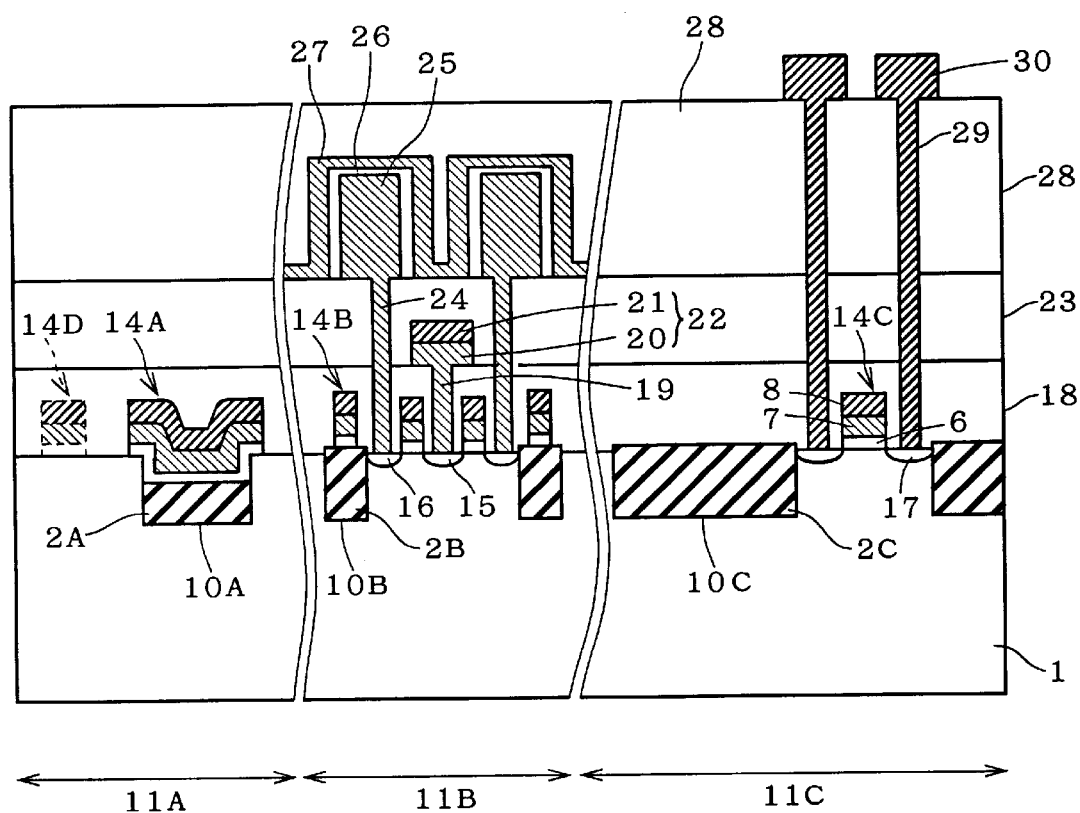

Next, as shown in FIG. 21, titanium nitride and Al are deposited by sputtering, and the Al wire layer 30 is formed by a photolithographic technology and dry etching. The Al wire layer 30 is electrically connected to the diffusion region 17 through the contact hole 29.

As described in the foregoing, in the manufacturing method according to the third preferred embodiment, by photolithography using the dummy gate electrode portion 14A as an alignment mark, alignment of patterns is performed to form the contact hole 19, the contact hole 24 and the contact hole 29. That is, the dummy gate electrode portion 14A, whose surface has the height difference which directly refrects the preliminary height difference between the surface of the silicon oxide films 2A and the surface of the silicon substrate 1 which is used for forming the gate electrode, is used as an alignment mark for forming the contact holes 19, 24 and 29.

As a result, it is possible to obtain an accuracy which is similar to the alignment accuracies for the gate electrode portions 14B and 14C, as an alignment accuracy for the contact holes 19, 24 and 29. This makes it possible to achieve the second object which aims at preventing a situation as that shown in FIG. 39 where the contact holes are formed off the active regions and the silicon oxide films 2B and 2C for element isolation are accordingly removed at the same time during opening of the contact holes so that a junction characteristic of the junctions with the active regions degrades.

Further, since the dummy gate electrode portion 14A, whose surface has the height difference which reflects the preliminary height difference between the surface of the silicon oxide films 2A and the surface of the silicon substrate 1, is used as an alignment mark, it is possible to detect the mark easily and accurately.

Still further, although the foregoing has described the third preferred embodiment in relation to processes for a dynamic RAM, it is clearly understood that the same effect is achieved during formation of a contact hole in other devices such as a logic device.

Modification

While the third preferred embodiment requires to perform alignment to the active regions by photolithography using the dummy gate electrode portion 14A as an alignment mark to form all of the contact hole 19, the contact hole 24 and the contact hole 29, the dummy gate electrode portion 14D may be used as an alignment mark as in the improved method which has been described with reference to FIGS. 34 to 47.

That is, when the contact hole 19, the contact hole 24 and the contact hole 29 are each formed, which one of the dummy gate electrode portions 14A and 14D is to be used as an alignment mark may be selected depending on necessity.

The dummy gate electrode portion 14D is formed simultaneously with the gate electrode portions 14B and 14C using the same pattern, and therefore, the positional accuracy of the dummy gate electrode portion 14D with respect to the gate electrode portions 14B and 14C is excellent. Meanwhile, the dummy gate electrode portion 14A as well is formed simultaneously with the gate electrode portions 14B and 14C. However, since the alignment mark used is the height difference in the surface of the dummy gate electrode portion 14A which reflects the preliminary height difference between the surface of the silicon oxide films 2A and the surface of the silicon substrate 1, the positional accuracy of the dummy gate electrode portion 14A with respect to the gate electrode portions 14B and 14C is inferior to that of the dummy gate electrode portion 14D.

Further, when the dummy gate electrode portion 14D is used as an alignment mark, as described in relation to the improved method which is shown in FIGS. 34 to 47, alignment to the isolation region (i.e., the trenches 10B, 10C and the silicon oxide films 2B, 2C) or the active regions 15 to 17 is indirect alignment, and therefore, an alignment error is large. However, since the dummy gate electrode portion 14A is determined by the position at which the trench 10A is formed, the positional accuracy of the dummy gate electrode portion 14A with respect to the isolation region (active regions) is high.

It is desirable to determine which one of the dummy gate electrode portions 14A and 14D to use as an alignment mark, considering the characteristics regarding the respective positional accuracies with the dummy gate electrode portions 14A and 14D used as an alignment mark.

Figure 22:
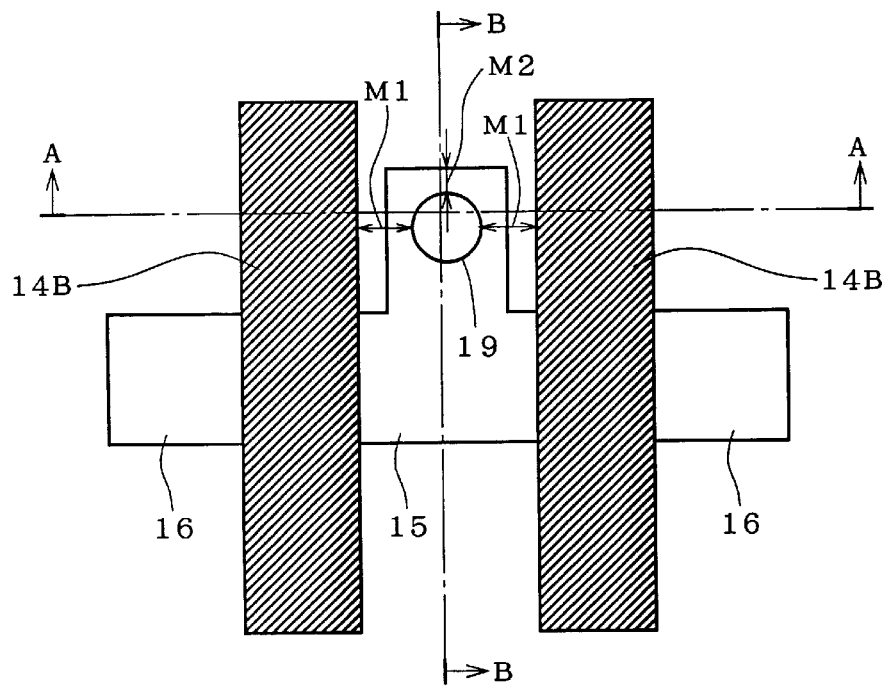
FIG. 22 is a plan view for describing an effect of a modification of the third preferred embodiment.
Figure 23:
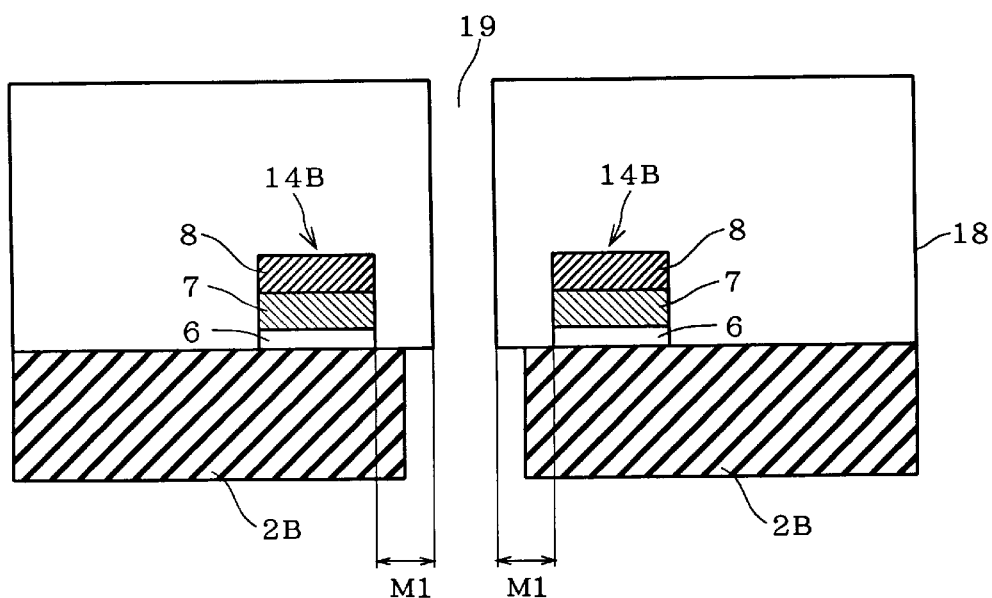
FIGS. 23 and 24 are cross sectional views showing a cross sectional structure of FIG. 22.
Figure 24:
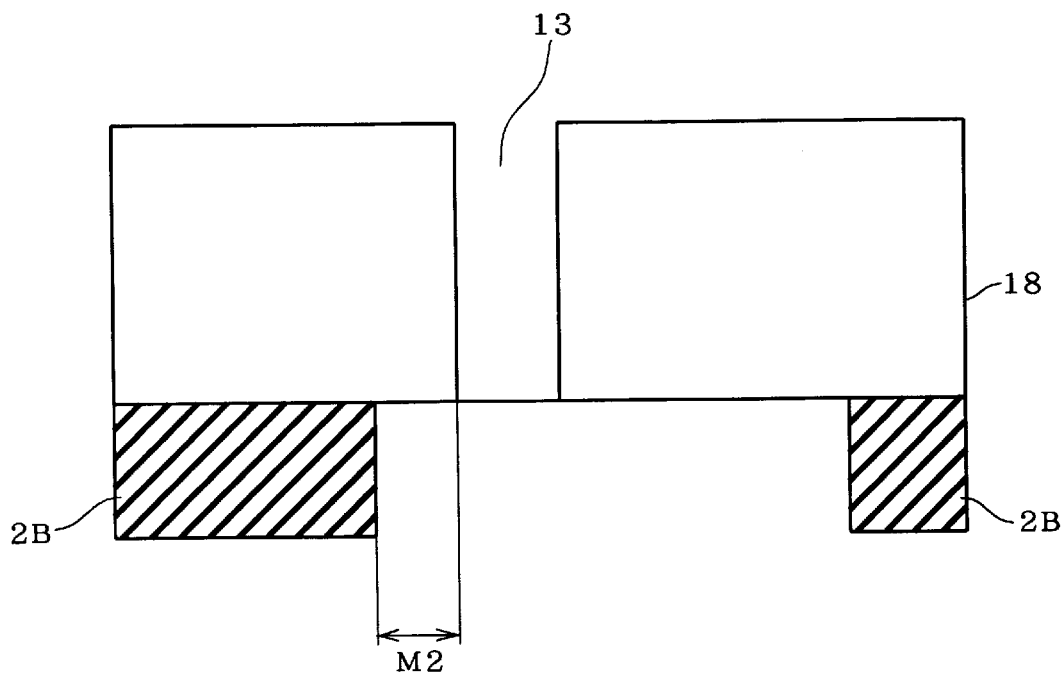

FIG. 22 is a plan view showing a planar structure with the contact hole 19 formed which is electrically connected to the diffusion region 15. FIG. 23 shows the A—A cross section of FIG. 22, and FIG. 24 shows the B—B cross section of FIG. 22. In FIG. 22, a region other than the diffusion regions 15 and 16 is the silicon oxide film 2B (not shown). As shown in FIGS. 22 to 24, there are a gate electrode margin M1 which is a tolerance for a positional error from the gate electrode portion 14B, and an active region margin M2 which is a tolerance for a positional error from the diffusion region 15.

The gate electrode margin M1 and the active region margin M2 are compared with each other. If the active region margin M2 is smaller, a high positional accuracy with respect to the diffusion region 15 is demanded, and therefore, the dummy gate electrode portion 14A is better as an alignment mark to use. On the other hand, if the gate electrode margin M1 is smaller, a high positional accuracy with respect to the gate electrode portion 14B is demanded, and therefore, the dummy gate electrode portion 14D is better as an alignment mark to use.

It is desirable to compare the gate electrode margin M1 and the active region margin M2 with each other for each one of the contact holes 19, 24 and 29 and determine which one of the dummy gate electrode portions 14A and 14D to use as an alignment mark in this manner.

While the invention has been described in detail, the foregoing description is in all aspects illustrative and not restrictive. It is understood that numerous other modifications and variations can be devised without departing from the scope of the invention.

We claim:

1. A method of manufacturing a semiconductor device which contains a trench-type element isolation structure, comprising the steps of:
   (a) preparing a semiconductor substrate which includes an alignment mark area and an element formation region;
   (b) forming a first trench and a second trench at the same time in an upper portion of said alignment mark area and element formation region, respectively;
   (c) forming an insulation film entirely on said semiconductor substrate;
   (d) forming a first resist pattern on said insulation film other than in at least the portion of said insulation film which is over said alignment mark area;
   (e) removing said insulation film using said first resist pattern as a mask;
   (f) further removing said insulation film after removing said first resist pattern so that said insulation film is partially left within a portion of said first trench and said insulation film is buried in said second trench, wherein the portion of said first trench in which said insulation film is partially left defines a first alignment mark, the height of a surface of an intra-alignment mark insulation film which is said insulation film partially left within said first trench being lower than a height of a surface of said semiconductor substrate so that a height different is set between the surfaces;
   (g) forming a conductive layer entirely on said semiconductor substrate;
   (h) detecting said first alignment mark to accurately position a second resist pattern to have a first portion on a predetermined gate formation region of said element formation region and a second separated portion at least on an edge region of said first trench that overlaps an edge of the first trench and a part of the semiconductor substrate adjacent the edge; and
   (i) removing said conductive layer using said second resist pattern portions as masks to form a gate electrode portion on said predetermined gate formation region and to form a separated first dummy electrode portion at least on said edge region of said first trench.

2. The method of manufacturing a semiconductor device of claim 1, wherein
   said second resist pattern separated portion is further formed on the entire region in which said first trench is formed,
   and said first dummy electrode portion is formed covering said first trench including said intra-alignment mark insulation film, while a height difference is formed in said first dummy electrode portion in such a manner that said height difference reflects a preliminary height difference between the surface of said intra-alignment mark insulation film and the surface of said semiconductor substrate.

3. The method of manufacturing a semiconductor device of claim 2, further comprising the steps of:
   (j) forming a diffusion region adjacent to said gate electrode within a surface of said element formation region;
   (k) forming an insulation layer entirely over said semiconductor substrate;
   (l) detecting the location of said first dummy electrode portion as a second alignment mark and forming a through hole which penetrates said insulation layer on said diffusion region; and
   (m) forming a diffusion region connecting conduction layer which is electrically connected to said diffusion region through said through hole.

4. The method of manufacturing a semiconductor device of claim 2, wherein
   said gate electrode portion includes at least one gate electrodes, said second resist pattern separated portion is further formed on a predetermined region of said alignment region other than said first trench, and
   a second dummy electrode portion is formed on said predetermined region of said alignment mark area at said step (i),
   said method further comprising a step of:
   (j) forming a first to an N-th diffusion regions (N≧2) adjacent to one of said at least one gate electrodes within a surface of said element formation region,
   said method further comprising steps (k) to (m), wherein said steps (k) to (m) are repeated N times in an order of i=1 to N;
   (k) forming an i-th insulation layer entirely over said semiconductor substrate;
   (l) detecting the location of a second alignment mark and forming, an i-th through holes which penetrate a first to an i-th insulation layers on said i-th diffusion region; and
   (m) forming an i-th diffusion region connecting conduction layer which is electrically connected to said i-th diffusion region through said i-th through hole, wherein said step (l) which is repeated N times requires to select either one of said first and said second dummy electrode portions as said second alignment mark for every execution of said step (l).

5. The method of manufacturing a semiconductor device of claim 1, wherein said second trench includes a narrow trench portion for a first circuit which has a first width and a wide trench portion for a second circuit which has a second width wider than said first width,
   said element formation region includes a first circuit formation region which is element-isolated by said narrow trench portion for the first circuit and a second circuit formation region which is element-isolated by said wide trench portion for the second circuit,
   and in step (d), forming said first resist pattern on said insulation film over said second formation region.

6. The method of manufacturing a semiconductor device of claim 5, wherein said first circuit formation region includes a region which is constituted of a memory cell of a dynamic type,
   and said second circuit formation region includes a region which forms a peripheral circuit which is capable of driving said memory cell.

* * * * *

UNITED STATES PATENT AND TRADEMARK OFFICE
CERTIFICATE OF CORRECTION

PATENT NO. : 6,218,262 B1
DATED : April 17, 2001
INVENTOR(S) : Kuroi et al.

It is certified that error appears in the above-identified patent and that said Letters Patent is hereby corrected as shown below:

<u>Title page, item [62],</u>
<u>Column 1,</u>
Related U.S. Application Data. Item [62] should read as follows:

Related U.S. Application Data

(62) Division of application No. 09/028,112, filed on Feb. 23, 1998, now Pat. No. 5,889,335.

Signed and Sealed this

Thirtieth Day of October, 2001

Attest:

NICHOLAS P. GODICI
Attesting Officer
Acting Director of the United States Patent and Trademark Office